United States Patent
Yamamoto et al.

(10) Patent No.: US 10,571,761 B2
(45) Date of Patent: Feb. 25, 2020

(54) ACTIVE MATRIX SUBSTRATE AND DEMULTIPLEXER CIRCUIT

(71) Applicant: Sharp Kabushiki Kaisha, Sakai, Osaka (JP)

(72) Inventors: Kaoru Yamamoto, Sakai (JP); Akihiro Oda, Sakai (JP); Tadayoshi Miyamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 41 days.

(21) Appl. No.: 16/123,045

(22) Filed: Sep. 6, 2018

(65) Prior Publication Data

US 2019/0079330 A1    Mar. 14, 2019

(30) Foreign Application Priority Data

Sep. 8, 2017   (JP) .................. 2017-172610

(51) Int. Cl.
*G02F 1/1345* (2006.01)
*H01L 29/786* (2006.01)
*H01L 27/12* (2006.01)
(Continued)

(52) U.S. Cl.
CPC ........ *G02F 1/13454* (2013.01); *G02F 1/1368* (2013.01); *G02F 1/13439* (2013.01); *G02F 1/133345* (2013.01); *G02F 1/134336* (2013.01); *G09G 3/3614* (2013.01); *G09G 3/3648* (2013.01); *H01L 27/124* (2013.01); (Continued)

(58) Field of Classification Search
CPC .............. G02F 1/13454; G02F 1/1368; G02F 1/13439; G02F 1/133345; G02F 1/134336; H01L 29/7869; H01L 27/1225; H01L 29/78648; H01L 27/124; G09G 3/3648; (Continued)

(56) References Cited

U.S. PATENT DOCUMENTS

| 6,552,706 B1 | 4/2003 | Ikeda et al. |
| 2008/0024416 A1 | 1/2008 | Onogi et al. |

(Continued)

FOREIGN PATENT DOCUMENTS

| JP | 2001-033757 A | 2/2001 |
| JP | 2006-119404 A | 5/2006 |

(Continued)

*Primary Examiner* — Thanhha S Pham
(74) *Attorney, Agent, or Firm* — Keating & Bennett, LLP

(57) ABSTRACT

An active matrix substrate includes a demultiplexer circuit which includes a plurality of DMX circuit TFTs. Each of the DMX circuit TFTs includes a front-gate electrode (FG) supplied with a control signal from one of a plurality of control signal main lines ASW, BSW and a back-gate electrode (BG) supplied with a back-gate signal which is different from the control signal. The plurality of DMX circuit TFTs includes first DMX circuit TFTs (T1a, T1b) and second DMX circuit TFTs (T2a, T2b). The back-gate electrode of each of the first DMX circuit TFTs (T1a, T1b) is connected with a first back-gate signal main line (BGL(1)) which supplies a first back-gate signal and, the back-gate electrode of each of the second DMX circuit TFTs (T2a, T2b) is connected with a second back-gate signal main line (BGL(2)) which supplies a second back-gate signal which is different from the first back-gate signal.

18 Claims, 23 Drawing Sheets

(51) Int. Cl.
  *G02F 1/136* (2006.01)
  *G02F 1/1343* (2006.01)
  *G02F 1/1333* (2006.01)
  *G09G 3/36* (2006.01)
  *G02F 1/1368* (2006.01)

(52) U.S. Cl.
  CPC ...... *H01L 27/1225* (2013.01); *H01L 29/7869* (2013.01); *H01L 29/78648* (2013.01); *G09G 2300/0426* (2013.01); *G09G 2310/0297* (2013.01)

(58) Field of Classification Search
  CPC ......... G09G 3/3614; G09G 2300/0426; G09G 2310/0297; G09G 3/3688
  See application file for complete search history.

(56) References Cited

U.S. PATENT DOCUMENTS

2008/0225024 A1  9/2008  Ito
2009/0323005 A1  12/2009  Ota
2012/0138922 A1  6/2012  Yamazaki et al.
2012/0320026 A1  12/2012  Kitayama et al.
2013/0038518 A1  2/2013  Tagawa et al.
2013/0320334 A1  12/2013  Yamazaki et al.
2014/0286076 A1  9/2014  Aoki et al.
2015/0108467 A1  4/2015  Moriguchi et al.
2019/0273168 A1* 9/2019  Matsukizono ...... H01L 27/1225

FOREIGN PATENT DOCUMENTS

| | | |
|---|---|---|
| JP | 2008-032899 A | 2/2008 |
| JP | 2008-225036 A | 9/2008 |
| JP | 2010-008758 A | 1/2010 |
| JP | 2010-102266 A | 5/2010 |
| JP | 2012-134475 A | 7/2012 |
| JP | 2014-007399 A | 1/2014 |
| JP | 2014-209727 A | 11/2014 |
| WO | 2011/093374 A1 | 8/2011 |
| WO | 2011/118079 A1 | 9/2011 |
| WO | 2012/086513 A1 | 6/2012 |

* cited by examiner

ACTIVE MATRIX SUBSTRATE AND DEMULTIPLEXER CIRCUIT

BACKGROUND

1. Technical Field

The present invention relates to an active matrix substrate which includes a demultiplexer circuit and to a demultiplexer circuit.

2. Description of the Related Art

An active matrix substrate for use in a liquid crystal display device, or the like, has a display region which includes a plurality of pixels and a region exclusive of the display region (non-display region or frame region). In the display region, each pixel includes a switching element, such as a thin film transistor (TFT). As such a switching element, a TFT which includes an amorphous silicon film as the active layer (hereinafter, "amorphous silicon TFT") and a TFT which includes a polycrystalline silicon film as the active layer (hereinafter, "polycrystalline silicon TFT") have been widely used in conventional devices.

Using an oxide semiconductor as a material of the active layer of TFTs, instead of amorphous silicon and polycrystalline silicon, has been proposed. Such TFTs are referred to as "oxide semiconductor TFTs". The oxide semiconductor has higher mobility than the amorphous silicon. Therefore, oxide semiconductor TFTs are capable of higher speed operation than amorphous silicon TFTs.

In some cases, peripheral circuits such as driving circuits are monolithically (integrally) formed in the non-display region of the active matrix substrate. By monolithically forming the driving circuits, narrowing of the non-display region and a cost reduction which is attributed to simplification of the mounting process are realized. For example, in some cases, in the non-display region, a gate driver circuit is monolithically formed, and a source driver circuit is mounted by a COG (Chip on Glass) technique.

For devices of which narrowing of the frame has been highly demanded, such as smartphones, monolithically forming a demultiplexer circuit such as source shared driving (SSD) circuit in addition to the gate driver has been proposed (e.g., WO 2011/118079 and Japanese Laid-Open Patent Publication No. 2010-102266). The SSD circuit is a circuit for distributing video data, which is supplied via a single video signal line from each terminal of the source driver, to a plurality of source lines. Incorporation of the SSD circuit enables further narrowing of the terminal portion in the non-display region and a region in which wires are provided (terminal-wire formation region). Further, the number of outputs from the source driver is reduced, and accordingly, the circuit size can be reduced. Therefore, the cost of the driver IC can be reduced.

A peripheral circuit, such as driving circuit, SSD circuit, or the like, includes TFTs. In this specification, a TFT which is provided as a switching element in each pixel of the display region is referred to as "pixel TFT", and a TFT which is a constituent of the peripheral circuit is referred to as "circuit TFT". Of the circuit TFTs, a TFT which is used as a switching element in a demultiplexer circuit (SSD circuit) is referred to as "DMX circuit TFT".

SUMMARY

The DMX circuit TFT has been required to have a high current drivability.

An object of an embodiment of the present invention is to provide a demultiplexer circuit including a thin film transistor which is capable of improving the drivability and an active matrix substrate including the demultiplexer circuit.

An active matrix substrate according to one embodiment of the present invention has a display region including a plurality of pixels and a non-display region provided around the display region, the active matrix substrate including: a substrate; a demultiplexer circuit provided in the non-display region and supported by the substrate; and a plurality of source bus lines extending in a first direction and a plurality of gate bus lines extending in a second direction in the display region, the second direction intersecting with the first direction, wherein the demultiplexer circuit includes a plurality of unit circuits, a plurality of DMX circuit TFTs, a plurality of control signal main lines, and a plurality of back-gate signal main lines which include at least a first back-gate signal main line and a second back-gate signal main line, each of the plurality of unit circuits is capable of distributing a video signal from one of a plurality of video signal lines to n source bus lines out of the plurality of source bus lines, n being an integer not less than 2, each of the plurality of unit circuits includes at least n DMX circuit TFTs out of the plurality of DMX circuit TFTs, n branch lines connected with the one video signal line, and the n source bus lines, each of the plurality of DMX circuit TFTs includes a lower gate electrode, a semiconductor layer provided on the lower gate electrode with a first insulating layer interposed therebetween, a source electrode and a drain electrode electrically coupled with the semiconductor layer, and an upper gate electrode provided on the semiconductor layer with a second insulating layer interposed therebetween, one of the upper gate electrode and the lower gate electrode is a front-gate electrode to which a control signal is supplied from one of the plurality of control signal main lines, and the other gate electrode is a back-gate electrode to which a back-gate signal is supplied, the back-gate signal being different from the control signal, the drain electrode is electrically coupled with one of the n source bus lines, and the source electrode is electrically coupled with one of the n branch lines, the plurality of DMX circuit TFTs includes first DMX circuit TFTs, the back-gate electrode of each of the first DMX circuit TFTs being connected with the first back-gate signal main line which supplies a first back-gate signal, and second DMX circuit TFTs, the back-gate electrode of each of the second DMX circuit TFTs being connected with the second back-gate signal main line which supplies a second back-gate signal which is different from the first back-gate signal.

In one embodiment, the video signal supplied to some source bus lines and the video signal supplied to some other source bus lines are a first video signal and a second video signal which have opposite polarities, each of the some source bus lines being connected to one of the first DMX circuit TFTs, and each of the some other source bus lines being connected to one of the second DMX circuit TFTs.

In one embodiment, when the first video signal has a positive polarity and the second video signal has a negative polarity, a potential of the first back-gate signal is higher than a potential of the second back-gate signal, and when the first video signal has a negative polarity and the second video signal has a positive polarity, a potential of the first back-gate signal is lower than a potential of the second back-gate signal.

In one embodiment, each of the first video signal and the second video signal is a signal whose polarity reverses at predetermined intervals, a potential of the first back-gate signal varies at the predetermined intervals according to a variation of the polarity of the first video signal such that the potential of the first back-gate signal is at a high level when the first video signal has a positive polarity and that the potential of the first back-gate signal is at a low level when the first video signal has a negative polarity, and a potential of the second back-gate signal varies at the predetermined intervals according to a variation of the polarity of the second video signal such that the potential of the second back-gate signal is at a high level when the second video signal has a positive polarity and that the potential of the second back-gate signal is at a low level when the second video signal has a negative polarity.

In one embodiment, the demultiplexer circuit includes a plurality of sub-circuits, each of the sub-circuits includes at least first and second unit circuits out of the plurality of unit circuits, and in the each sub-circuit, the n source bus lines of the first unit circuit and the n source bus lines of the second unit circuit are arranged alternately in a one-by-one fashion in the second direction in the display region.

In one embodiment, the n source bus lines of the first unit circuit is supplied with the first video signal, and the n source bus lines of the second unit circuit is supplied with the second video signal.

In one embodiment, each of the plurality of unit circuits further includes n control signal branch lines, each of the n control signal branch lines being electrically coupled with one of the plurality of control signal main lines, and the n control signal branch lines in the first unit circuit and the second unit circuit are common.

In one embodiment, the front-gate electrode of the each DMX circuit TFT is a part of one of the n control signal branch lines, the source electrode of the each DMX circuit TFT is a part of one of the n branch lines, and the drain electrode of the each DMX circuit TFT is a part of one of the n source bus lines, and in each of the plurality of unit circuits, each of the n control signal branch lines, the n branch lines and the n source bus lines extends in the first direction.

In one embodiment, in the each sub-circuit, a first unit circuit formation region in which the at least n DMX circuit TFTs of the first unit circuit are to be formed is present between a second unit circuit formation region in which the at least n DMX circuit TFTs of the second unit circuit are to be formed and the display region.

In one embodiment, at least one of the first back-gate signal main line and the second back-gate signal main line extends in the second direction through a gap between the first unit circuit formation region and the second unit circuit formation region.

In one embodiment, the plurality of control signal main lines includes a plurality of first control signal main lines and a plurality of second control signal main lines, the front-gate electrode of the each of the first DMX circuit TFTs is connected with one of the plurality of first control signal main lines, the front-gate electrode of the each of the second DMX circuit TFTs is connected with one of the plurality of second control signal main lines, when the first video signal has a positive polarity and the second video signal has a negative polarity, a high-level potential of the control signal supplied from the plurality of first control signal main lines is higher than a high-level potential of the control signal supplied from the plurality of second control signal main lines, and when the first video signal has a negative polarity and the second video signal has a positive polarity, a high-level potential of the control signal supplied from the plurality of first control signal main lines is lower than a high-level potential of the control signal supplied from the plurality of second control signal main lines.

In one embodiment, the each sub-circuit further includes third and fourth unit circuits out of the plurality of unit circuits, and the n source bus lines of the third unit circuit and the n source bus lines of the fourth unit circuit are arranged alternately in a one-by-one fashion in the second direction in the display region, the first and third unit circuits share n first control signal branch lines each electrically coupled with any of the first control signal main lines and n first back-gate signal branch lines electrically coupled with the first back-gate signal main line, and the second and fourth unit circuits share n second control signal branch lines each electrically coupled with any of the second control signal main lines and n second back-gate signal branch lines electrically coupled with the second back-gate signal main line.

In one embodiment, the front-gate electrode of the each DMX circuit TFT is a part of one of the n first or second control signal branch lines, the back-gate electrode of the each DMX circuit TFT is a part of one of the n first or second back-gate signal branch lines, the source electrode of the each DMX circuit TFT is a part of one of the n branch lines, and the drain electrode of the each DMX circuit TFT is a part of one of the n source bus lines, and in the each sub-circuit, each of the n first control signal branch lines, the n second control signal branch lines, the n first back-gate signal branch lines, the n second back-gate signal branch lines, the n branch lines and the n source bus lines extends in the first direction.

In one embodiment, in the each sub-circuit, a first unit circuit formation region in which the at least n DMX circuit TFTs of the first unit circuit and the second unit circuit are to be formed is present between a second unit circuit formation region in which the at least n DMX circuit TFTs of the third unit circuit and the fourth unit circuit are to be formed and the display region.

In one embodiment, the semiconductor layer is an oxide semiconductor layer.

In one embodiment, the oxide semiconductor layer includes an In—Ga—Zn—O based semiconductor.

In one embodiment, the In—Ga—Zn—O based semiconductor includes a crystalline portion.

A demultiplexer circuit according to one embodiment of the present invention includes: a plurality of unit circuits; a plurality of DMX circuit TFTs, a plurality of control signal main lines; and a plurality of back-gate signal main lines including at least a first back-gate signal main line and a second back-gate signal main line, wherein each of the plurality of unit circuits is capable of distributing a video signal from one of a plurality of video signal lines to n source bus lines out of a plurality of source bus lines, n being an integer not less than 2, each of the plurality of unit circuits includes at least n DMX circuit TFTs out of the plurality of the DMX circuit TFTs, n branch lines connected with the one video signal line, and the n source bus lines, each of the plurality of DMX circuit TFTs includes a lower gate electrode, a semiconductor layer provided on the lower gate electrode with a first insulating layer interposed therebetween, a source electrode and a drain electrode electrically coupled with the semiconductor layer, and an upper gate electrode provided on the semiconductor layer with a second insulating layer interposed therebetween, one of the upper gate electrode and the lower gate electrode is a front-gate electrode to which a control signal is supplied from one of the plurality of control signal main lines, and the other gate electrode is a back-gate electrode to which a back-gate signal is supplied, the back-gate signal being different from the control signal, the drain electrode is electrically coupled with one of the n source bus lines, and the source electrode is electrically coupled with one of the n branch lines, the plurality of DMX circuit TFTs includes first DMX circuit TFTs, the back-gate electrode of each of the first DMX circuit TFTs being connected with the first back-gate signal main line which supplies a first back-gate signal, and second DMX circuit TFTs, the back-gate electrode of each of the second DMX circuit TFTs being connected with the second back-gate signal main line which supplies a second back-gate signal which is different from the first back-gate signal.

According to an embodiment of the present invention, a demultiplexer circuit including a thin film transistor which is capable of improving the drivability and an active matrix substrate including the demultiplexer circuit are provided.

BRIEF DESCRIPTION OF THE DRAWINGS

FIG. 10A shows a DMX circuit TFT 71 where a video signal of a positive polarity is supplied to a source bus line SL. FIG. 10B shows a DMX circuit TFT 72 where a video signal of a negative polarity is supplied to the source bus line SL.

FIG. 11A shows the DMX circuit TFT 71 where a video signal of a positive polarity is supplied to the source bus line SL. FIG. 11B shows the DMX circuit TFT 72 where a video signal of a negative polarity is supplied to the source bus line SL.

FIG. 19A shows the DMX circuit TFT 71 where a video signal of a positive polarity is supplied to the source bus line SL. FIG. 19B shows the DMX circuit TFT 72 where a video signal of a negative polarity is supplied to the source bus line SL.

FIG. 20A shows the DMX circuit TFT 71 where a video signal of a positive polarity is supplied to the source bus line SL. FIG. 20B shows the DMX circuit TFT 72 where a video signal of a negative polarity is supplied to the source bus line SL.

DETAILED DESCRIPTION

First Embodiment

Hereinafter, an active matrix substrate of the first embodiment is described with reference to the drawings. In the following paragraphs, an example of the active matrix substrate is described in which a SSD circuit and a gate driver are monolithically formed and to which a source driver is mounted. Note that the active matrix substrate of the present embodiment only requires that a peripheral circuit which includes at least one TFT is monolithically formed.

<Configuration of Active Matrix Substrate>

Figure 1:
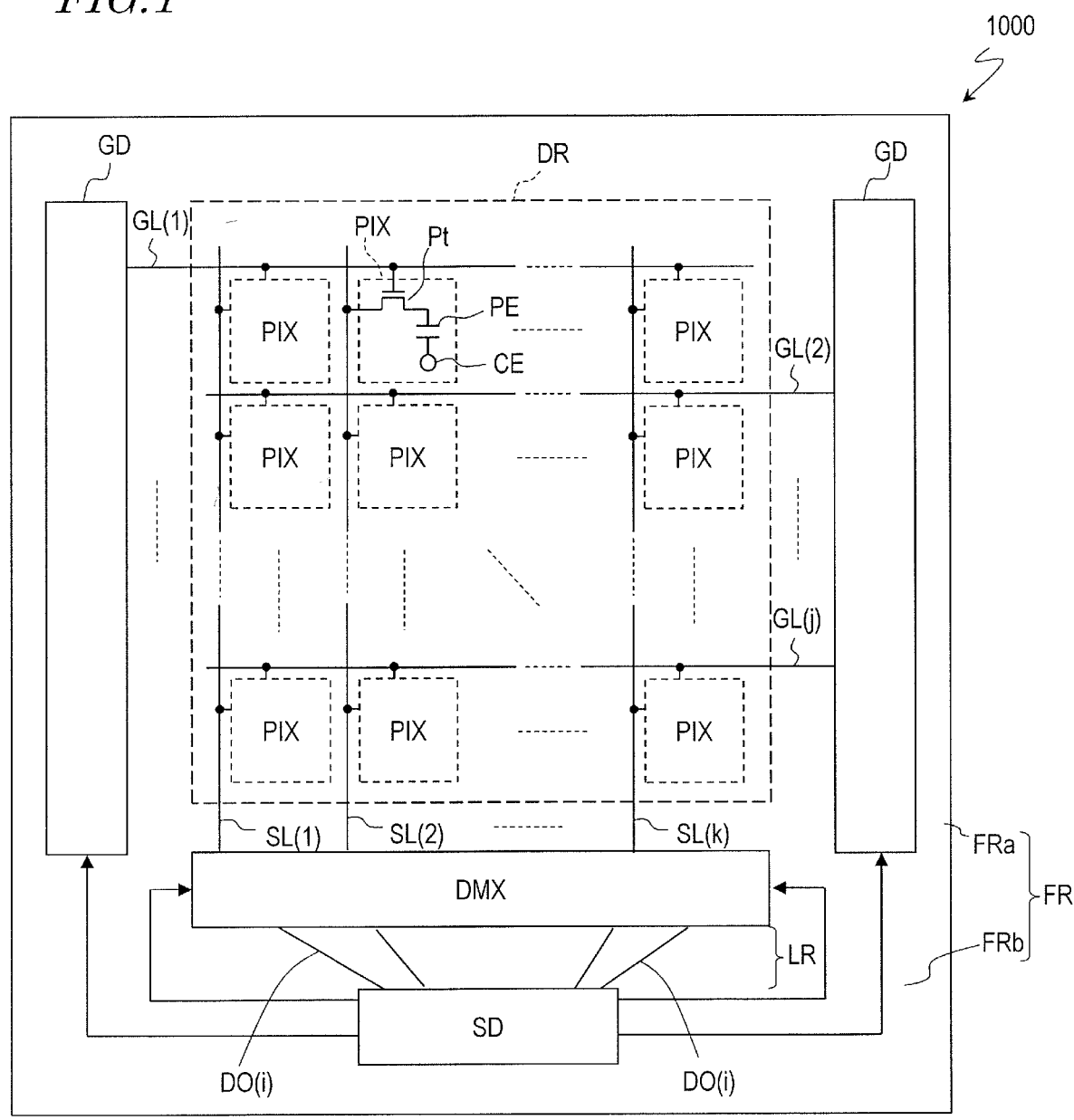
FIG. 1 is a schematic diagram showing an example of a planar configuration of an active matrix substrate 1000 of the first embodiment of the present invention.
Figure 1:
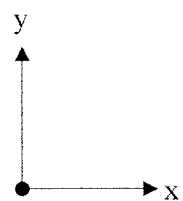

FIG. 1 is a schematic diagram showing an example of a planar configuration of an active matrix substrate 1000 of the present embodiment.

The active matrix substrate 1000 includes a display region DR and a region (non-display region or frame region) FR which is exclusive of the display region DR. The display region DR includes pixel regions PIX arranged in a matrix. The pixel regions PIX (also simply referred to as "pixels") are regions corresponding to the pixels of a display device. The non-display region FR is a region which extends around the display region DR and which does not contribute to displaying.

In the display region DR, a plurality of gate bus lines GL(1) to GL(j) (j is an integer not less than 2; hereinafter generically referred to as "gate bus lines GL") extending in the x direction (also referred to as "row direction" or "second direction") and a plurality of source bus lines SL(1) to SL(k) (k is an integer not less than 2; hereinafter generically referred to as "source bus lines SL") extending in the y direction (also referred to as "column direction" or "first direction") are provided. Each of the pixel regions PIX is defined by, for example, the gate bus lines GL and the source bus lines SL. The gate bus lines GL are respectively connected with corresponding terminals of a gate driver GD. The source bus lines SL are respectively connected with corresponding terminals of a source driver SD.

Each of the pixel regions PIX includes a thin film transistor Pt and a pixel electrode PE. The thin film transistor Pt is also referred to as "pixel TFT". The gate electrode of the thin film transistor Pt is electrically coupled with a corresponding gate bus line GL. The source electrode of the thin film transistor Pt is electrically coupled with a corresponding source bus line SL. The drain electrode of the thin film transistor Pt is electrically coupled with the pixel electrode PE. When the active matrix substrate 1000 is applied to a display device of transverse electric field mode such as FFS (Fringe Field Switching) mode, an electrode CE common to a plurality of pixels (common electrode) is provided in the active matrix substrate 1000. When the active matrix substrate 1000 is applied to a display device of longitudinal electric field mode, the common electrode CE is provided in a counter substrate which opposes the active matrix substrate 1000 with a liquid crystal layer interposed therebetween.

In the non-display region FR, for example, the gate driver GD for driving the gate bus lines GL, a demultiplexer circuit DMX, and other components may be integrally (monolithically) provided. The demultiplexer circuit DMX functions as a SSD circuit for driving the source bus lines SL in a time division manner. The source driver SD for driving the source bus lines SL may be mounted to, for example, the active matrix substrate 1000.

In the example shown in the drawing, the gate driver GD is provided in regions FRa on opposing sides such that the display region DR is interposed between the regions FRa, and the source driver SD is mounted in a region FRb on the lower side of the display region DR. The demultiplexer circuit DMX is provided in the region FRb between the display region DR and the source driver SD. A region between the demultiplexer circuit DMX and the source driver SD is a terminal-wire formation region LR in which a plurality of terminal portions and wires are to be provided.

In a display panel which uses the active matrix substrate 1000, line sequential scanning is carried out. In a line sequential scanning system, a video signal (also referred to as "display signal") supplied to the pixel electrode PE is a signal supplied to a source bus line SL connected with a thin film transistor Pt which is selected by a control signal supplied from the gate driver GD to the gate bus line GL and which is turned to an ON state. Therefore, thin film transistors Pt connected with one gate bus line GL are concurrently turned to an ON state, and at that time, corresponding video signals are supplied from source bus lines SL connected with respective ones of the thin film transistors Pt of the pixel regions PIX of that row. This operation is carried out, for example, sequentially from the uppermost pixel row to the lowermost pixel row of the display plane, whereby a single image (frame) is written in and displayed on the display region DR. Note that a period between selection of one pixel row and selection of a succeeding row is referred to as "horizontal scan period (1H)", and a period between selection of one row and subsequent selection of that row is referred to as "vertical scan period (1V)" or "frame".

Driving of the display panel is usually AC driving. Typically, frame inversion driving is carried out such that the polarity of the video signal is reversed at intervals of one frame (at intervals of one vertical scan period). For example, the polarity is reversed at intervals of 1/60 sec (the period of polarity reversal is 30 Hz).

In order to achieve an even distribution of pixels to which voltages of different polarities are applied within each frame, dot inversion driving, column inversion (source line inversion) driving, or the like, is carried out. Dot inversion driving is a driving system in which the polarity of the video signal is reversed at intervals of one frame and the polarities of pixels adjoining in the vertical or horizontal direction are reversed. Column inversion driving is a driving system in which the polarity of the pixel voltage is reversed at intervals of one frame and is reversed at intervals of a predetermined number of source bus lines. Another driving system is also known in which the polarity of the source bus line SL is reversed at intervals of one frame in a display panel configured such that the positional relationship between a pixel and a source bus line SL corresponding to that pixel varies every pixel row (Z-inversion driving system). Such a system is disclosed in, for example, Japanese Laid-Open Patent Publication No. 2001-33757 and WO 2011/093374. The entire disclosures of Japanese Laid-Open Patent Publication No. 2001-33757 and WO 2011/093374 are incorporated by reference in this specification.

In a display panel to which a driving system, such as column inversion driving, Z-inversion driving, dot inversion driving, or the like, is applied, some of the plurality of source bus lines SL are supplied with a video signal of the first polarity (hereinafter, referred to as "first video signal"), and the other source bus lines SL are supplied with a video signal of the second polarity that is opposite to the first polarity (hereinafter, referred to as "second video signal"). The polarities of the first and second video signals reverse at intervals of one frame. In this specification, a source bus line SL which is supplied with a first video signal is referred to as "first polarity source bus line", and a source bus line SL which is supplied with a second video signal is referred to as "second polarity source bus line". The first polarity source bus lines and the second polarity source bus lines are arranged alternately in sets of Z source bus lines (Z is an integer not less than 1; e.g., Z=1).

<Configuration of Demultiplexer Circuit DMX>

As shown in FIG. 1, each of the output terminals of the source driver SD is connected with any of a plurality of video signal lines DO(1) to DO(i) (also generically referred to as "video signal lines DO"). In the demultiplexer circuit DMX, a group of n source bus lines SL is associated with a single video signal line DO. Between the video signal lines DO and groups of source bus lines SL, a unit circuit is provided for each group of video signal lines. Each unit circuit distributes video data from a single video signal line DO to n source bus lines SL.

The demultiplexer circuit DMX of the present embodiment includes a plurality of unit circuits, a plurality of control signal main lines, and a plurality of back-gate signal main lines. The back-gate signal main lines include at least a first back-gate signal main line and a second back-gate signal main line.

Each of the unit circuit includes at least n DMX circuit TFTs and n branch lines connected with a single video signal line DO.

The front-gate electrode FG of the DMX circuit TFT is supplied with a selection signal (control signal) from a corresponding control signal main line. The control signal defines the ON period of a selection switch in the same group and is in synchronization with time-series based signal output from the source driver SD. The unit circuit writes a data potential obtained by time division of the output of the video signal line DO in the plurality of source bus lines SL in a time-series manner (time division driving). This can reduce the number of V-terminals of the source driver SD and, therefore, the area of the non-display region FR can be further reduced (narrowing of the frame).

In the present embodiment, as the DMX circuit TFT, a double gate structure TFT is used which includes two gate electrodes arranged such that an oxide semiconductor layer is interposed between the two gate electrodes. One of these gate electrodes provided on the substrate side of the oxide semiconductor layer is also referred to as "lower gate electrode", and the other gate electrode provided above the oxide semiconductor layer is also referred to as "upper gate electrode". The source electrode of each DMX circuit TFT is electrically coupled with a corresponding one of the branch lines B. The drain electrode of the DMX circuit TFT is coupled with a corresponding one of the source bus lines. One of the upper gate electrode and the lower gate electrode is a front-gate electrode FG which is supplied with a control signal for controlling the ON/OFF operation of the DMX circuit TFT, and the other is a back-gate electrode BG which is supplied with a signal different from the control signal ("back-gate signal").

The back-gate electrode BG of a DMX circuit TFT connected with some of the plurality of source bus lines SL(1) to SL(k) is supplied with a first back-gate signal from the first back-gate signal main line. The back-gate electrode BG of a DMX circuit TFT connected with some others of the source bus lines SL is supplied with a second back-gate signal from the second back-gate signal main line. The second back-gate signal is different from the first back-gate signal.

One example may be configured such that a DMX circuit TFT connected with a first polarity source bus line is supplied with a first back-gate signal, and a DMX circuit TFT connected with a second polarity source bus line SL is supplied with a second back-gate signal. Thus, the potentials of the back-gate signals can be made different according to the polarity of a source write voltage (the polarity of the voltage of the video signal). Specifically, when a video signal of a positive polarity is supplied to the first polarity source bus line SL and a video signal of a negative polarity is supplied to the second polarity source bus line, the potential of the first back-gate signal supplied to a thin film transistor connected with the first polarity source bus line SL (the potential applied to the back-gate electrode BG) may be higher than the potential of the second back-gate signal supplied to a thin film transistor connected with the second polarity source bus line SL. When a video signal of a negative polarity is supplied to the first polarity source bus line SL and a video signal of a positive polarity is supplied to the second polarity source bus line, the potential of the first back-gate signal may be lower than the potential of the second back-gate signal. According to such a configuration, irrespective of the writing polarity, the backgate-source voltage (back-gate voltage) Vbg of each DMX circuit TFT can be controlled so as to be within a predetermined range. Therefore, the drivability can be improved while deterioration of the DMX circuit TFT due to voltage stress is suppressed. This effect will be described in detail later.

The first and second back-gate signals are preferably set such that, in writing, a positive bias is applied to the back-gate electrode BG (i.e., back-gate voltage (backgate-source potential) Vbg>0 holds). This allows effectually further decreasing the threshold voltage of each DMX circuit TFT and, therefore, the drivability can be further improved.

The first and second video signals may be signals whose polarity reverses at constant intervals. In this case, the potentials of the first and second back-gate signals may be changed at constant intervals in accordance with the change of the polarity of the voltage of the video signal.

Specifically, the potential of the first back-gate signal may be changed at constant intervals in accordance with the change of the polarity of the first video signal such that the potential of the first back-gate signal is at a high level when the first video signal has a positive polarity but is at a low level when the first video signal has a negative polarity. Likewise, the potential of the second back-gate signal may be changed at constant intervals in accordance with the change of the polarity of the second video signal such that the potential of the second back-gate signal is at a high level when the second video signal has a positive polarity but is at a low level when the second video signal has a negative polarity.

The demultiplexer circuit DMX may include a sub-circuit which includes at least two unit circuits (hereinafter, referred to as "first unit circuit" and "second unit circuit"). For example, n source bus lines SL connected with the DMX circuit TFT of the first unit circuit and n source bus lines SL connected with the DMX circuit TFT of the second unit circuit may be arranged alternately in sets of Z source bus lines (Z is an integer not less than 1; herein, Z=1) in the row direction. In this case, the DMX circuit TFT of the first unit circuit may be connected with the first polarity source bus line, and the DMX circuit TFT of the second unit circuit may be connected with the second polarity source bus line.

Each unit circuit may further include n control signal branch lines and/or n back-gate signal branch lines. Each of the control signal branch lines is electrically coupled with a corresponding one of the control signal main lines. Each of the back-gate signal branch lines is electrically coupled with a corresponding one of the back-gate signal main lines. As will be described later, the first unit circuit and the second unit circuit of each sub-circuit may have a common control signal branch line.

The operation of a display device with the use of the demultiplexer circuit DMX and the timing chart of the time division driving are disclosed in, for example, Japanese Laid-Open Patent Publication No. 2008-225036, Japanese Laid-Open Patent Publication No. 2006-119404, and WO 2011/118079. The entire disclosures of Japanese Laid-Open Patent Publication No. 2008-225036, Japanese Laid-Open Patent Publication No. 2006-119404, and WO 2011/118079 are incorporated by reference in this specification.

Hereinafter, the configuration of the demultiplexer circuit DMX of the present embodiment is described more specifically.

Figure 2:
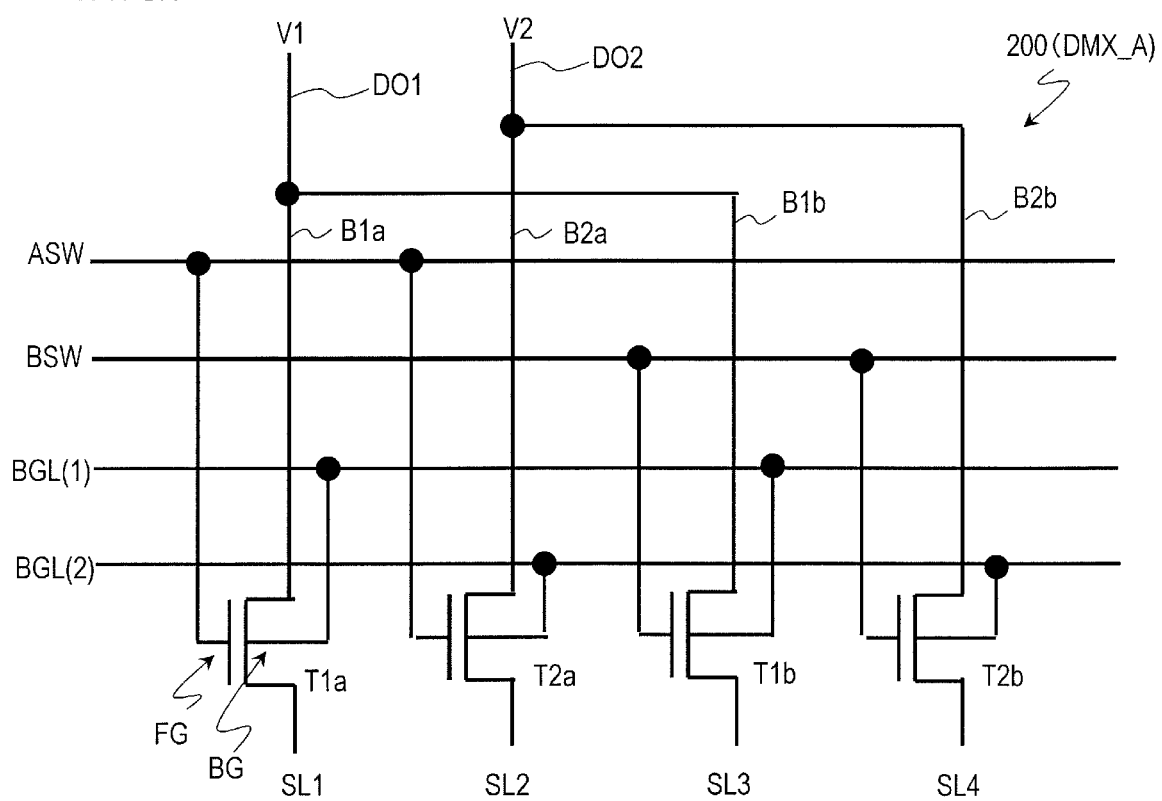
FIG. 2 is a diagram showing a single sub-circuit 200 in an alternative demultiplexer circuit DMX_A.

FIG. 2 is a diagram showing part of a demultiplexer circuit DMX_A of the present embodiment. FIG. 2 shows a sub-circuit 200 which includes the first unit circuit and the second unit circuit.

In FIG. 2, only four of a plurality of source bus lines SL are shown. These four source bus lines are referred to sequentially from one side (herein, from the left side) as "first source bus line SL1", "second source bus line SL2", "third source bus line SL3" and "fourth source bus line SL4". For example, the first and third source bus lines SL1, SL3 are first polarity source bus lines to which a video signal V1 of the first polarity is supplied. The second and fourth source bus lines SL2, SL4 are second polarity source bus lines to which a video signal V2 of the second polarity that is opposite to the first polarity is supplied.

The sub-circuit 200 includes first and second unit circuits, a plurality of (herein, two) control signal main lines ASW, BSW (hereinafter, also generically referred to as "control signal main lines SW"), and first and second back-gate signal main lines BGL(1), BGL(2) (hereinafter, also generically referred to as "back-gate signal main lines BGL").

In this example, each unit circuit is associated with two source bus lines SL (i.e., n=2). The first unit circuit is associated with the first source bus line SL1 and the third source bus line SL3 which are the first polarity source bus lines. The video signal V1 from a corresponding video signal line DO1 is distributed to the first source bus line SL1 and the third source bus line SL3 via the first unit circuit. The second unit circuit is associated with the second source bus line SL2 and the fourth source bus line SL4 which are the second polarity source bus lines. The video signal V2 from a video signal line DO2, which is different from that of the first unit circuit, is distributed to the second source bus line SL2 and the fourth source bus line SL4 via the second unit circuit.

The first unit circuit includes two thin film transistors (DMX circuit TFTs) T1a, T1b and two branch lines B1a, B1b. The second unit circuit includes two thin film transistors T2a, T2b and two branch lines B2a, B2b. The branch lines B1a, B1b of the first unit circuit are electrically coupled with the video signal line DO1. The branch lines B2a, B2b of the second unit circuit are electrically coupled with the video signal line DO2.

The drain electrodes of the thin film transistors T1a, T1b of the first unit circuit are connected with the first source bus line SL1 and the third source bus line SL3, respectively. The source electrodes of the thin film transistors T1a, T1b are connected with the branch lines B1a, B1b, respectively. The drain electrodes of the thin film transistors T2a, T2b of the second unit circuit are connected with the second source bus line SL2 and the fourth source bus line SL4, respectively. The source electrodes of the thin film transistors T2a, T2b are connected with the branch lines B2a, B2b, respectively. The front-gate electrodes FG of the thin film transistors T1a, T2a are connected with the control signal main line ASW. A control signal is supplied from the control signal main line ASW to these front-gate electrodes FG. The front-gate electrodes FG of the thin film transistors T1b, T2b are connected with the control signal main line BSW. A control signal is supplied from the control signal main line BSW to these front-gate electrodes FG.

The back-gate electrodes BG of the thin film transistors T1a, T1b of the first unit circuit connected with the first polarity source bus lines are electrically coupled with the back-gate signal main line BGL(1). To these back-gate electrodes BG, a first back-gate signal is supplied from the back-gate signal main line BGL(1). Meanwhile, the back-gate electrodes BG of the thin film transistors T2a, T2b of the second unit circuit connected with the second polarity source bus lines are electrically coupled with the back-gate signal main line BGL(2). To these back-gate electrodes BG, a second back-gate signal is supplied from the back-gate signal main line BGL(2).

When a video signal of a positive polarity is supplied to the first polarity source bus lines SL and a video signal of a negative polarity is supplied to the second polarity source bus lines, the potential of the first back-gate signal supplied to the thin film transistors T1a, T1b connected with the first polarity source bus lines SL may be set higher than the potential of the second back-gate signal supplied to the thin film transistors T2a, T2b connected with the second polarity source bus lines SL. When a video signal of a negative polarity is supplied to the first polarity source bus lines SL and a video signal of a positive polarity is supplied to the second polarity source bus lines, the potential of the first back-gate signal may be set lower than the potential of the second back-gate signal.

Figure 25:
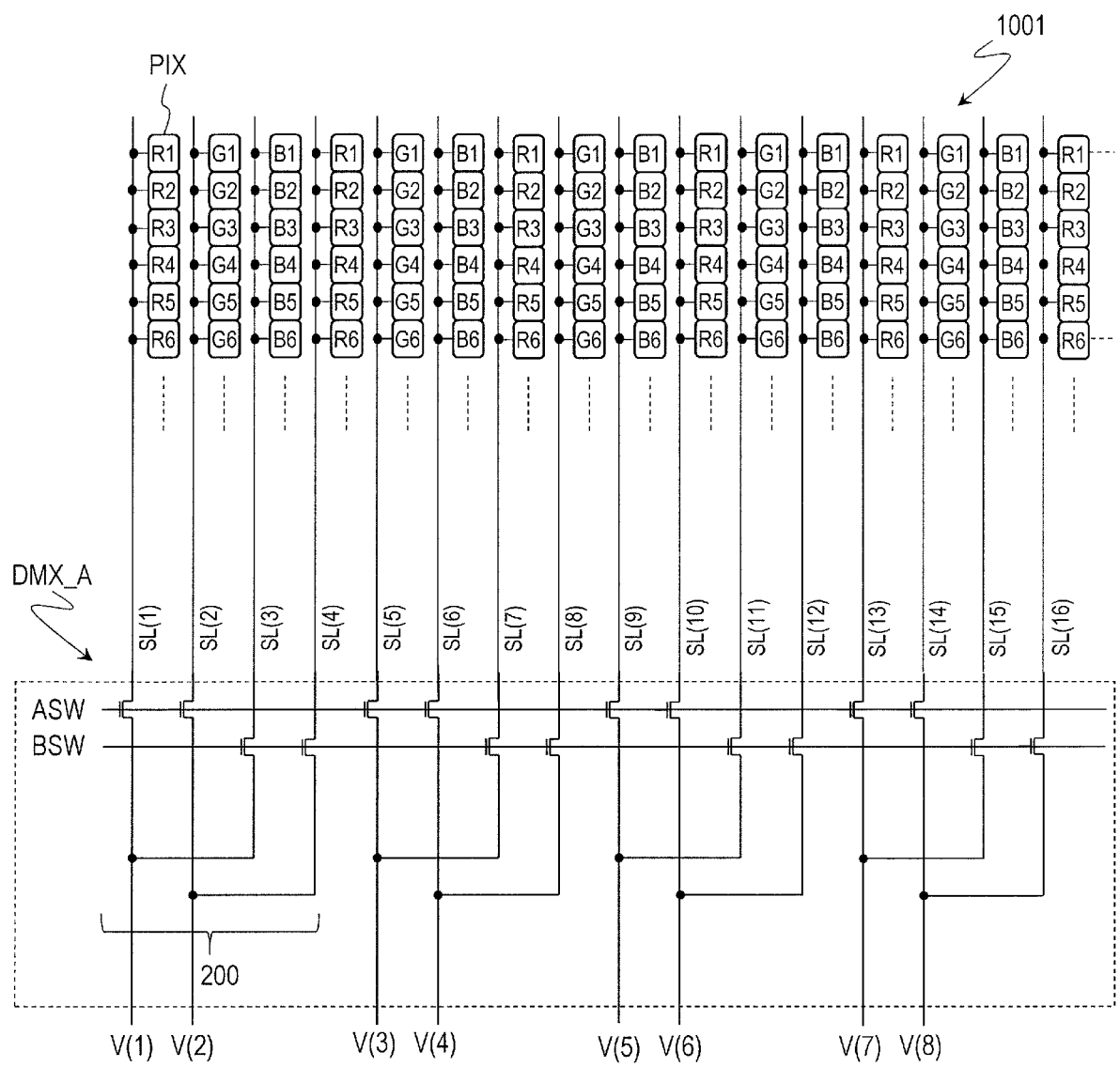
FIG. 25 is a plan view illustrating a display panel of a column inversion driving system which includes a demultiplexer circuit DMX_A.
Figure 26:
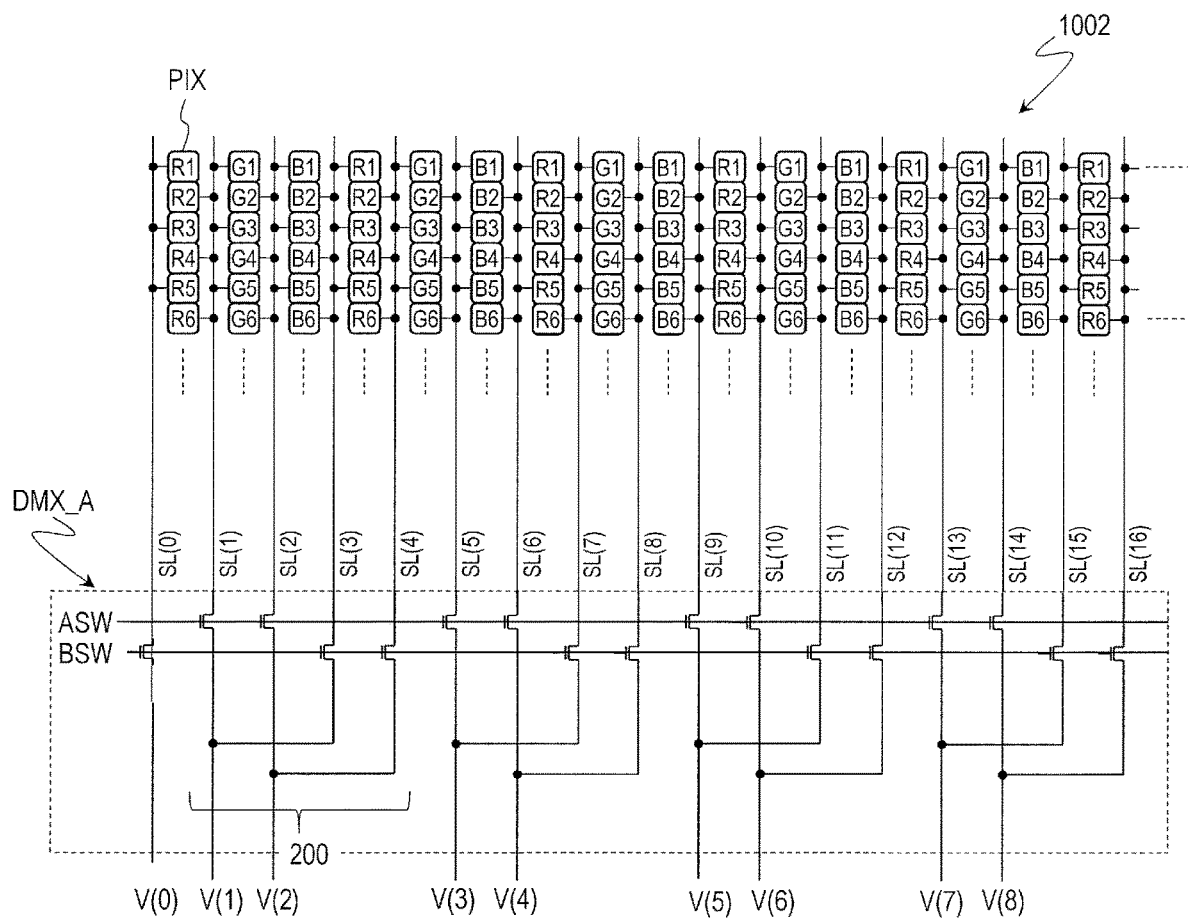
FIG. 26 is a plan view illustrating a display panel of a Z-inversion driving system which includes a demultiplexer circuit DMX_A.

FIG. 25 and FIG. 26 are plan views illustrating display panels 1001, 1002, respectively, which include the demultiplexer circuit DMX_A. FIG. 25 shows the display panel of a column inversion driving system. FIG. 26 shows the display panel of a Z-inversion driving system. In these drawings, the back-gate signal main lines are not shown.

In the display panels 1001, 1002, the first polarity source bus lines and the second polarity source bus lines are arranged alternately in a one-by-one fashion in the row direction. Between adjoining two source bus lines SL, there are a plurality of pixel electrodes which are arranged in the column direction to form a pixel column.

In the display panel 1001 of the column inversion driving system, a plurality of pixel electrodes in each pixel column are all connected with the same source bus line SL. In a plurality of pixel electrodes of one pixel column, video signals of the same polarity are written. In the pixel electrodes of a pixel column adjoining that pixel column, video signals of the opposite polarity are written. Thus, between pixels adjoining in the row direction, the pixel electrode voltages have different polarities.

On the other hand, in the display panel 1002 of the Z-inversion driving system, in each pixel column, pixel electrodes connected with a source bus line SL located on the right side and pixel electrodes connected with a source bus line SL located on the left side are alternately arranged. Therefore, not only between pixels adjoining in the row direction but also between pixels adjoining in the column direction, the pixel electrode voltages have different polarities.

<Operation of Demultiplexer Circuit DMX>

Next, the operation of the demultiplexer circuit DMX_A based on the column inversion driving system or the Z-inversion driving system is described.

Figure 3:
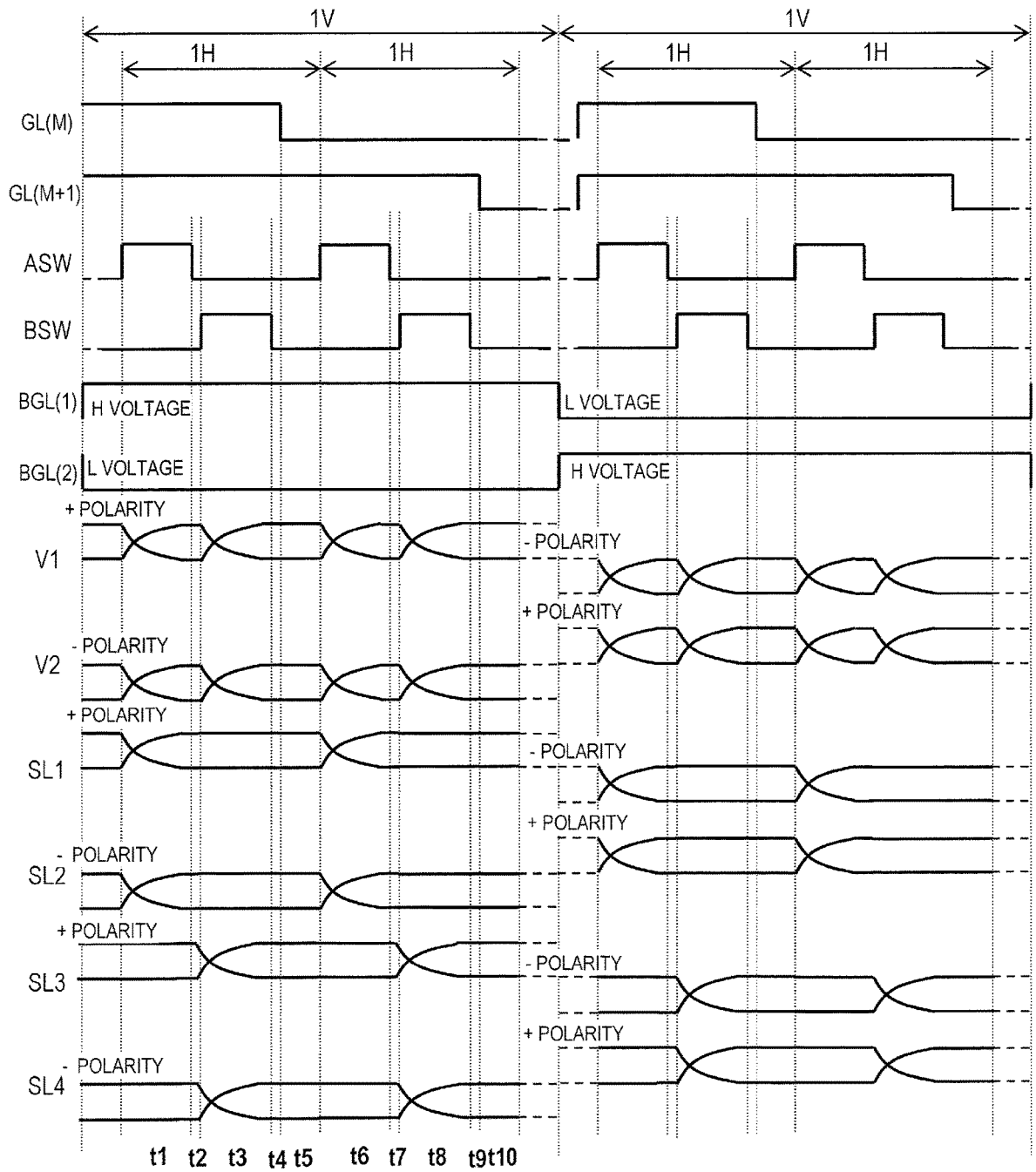
FIG. 3 is a timing chart illustrating an example of the signal waveforms in the sub-circuit 200.

FIG. 3 is a timing chart illustrating an example of the signal waveforms in the sub-circuit 200 of the demultiplexer circuit DMX_A (FIG. 2). FIG. 3 shows the signal waveforms of the gate bus lines GL, the control signal main lines ASW, BSW, the video signals V1, V2, the source bus lines SL1 to SL4, and the back-gate signal main lines BGL(1), BGL(2). Herein, only the writing operation portion in the gate bus line GL(M) of the Mth stage and the gate bus line GL(M+1) of the $(M+1)^{th}$ stage is described.

The horizontal axis represents the time. Periods t1 to t5 represent the time of writing in the gate bus line GL(M) (1H period). Periods t6 to t10 represent the time of writing in the gate bus line GL(M+1) (1H period). 1V period is a vertical scan period (or frame) between selection of one row and subsequent selection of that row and includes periods t1 to t10.

In the column inversion driving system and the Z-inversion driving system, the polarities of the video signals V1, V2 are reversed at intervals of 1V period. Accordingly, in this example, the potential of each back-gate signal main line BGL is switched between the high-level potential and the low-level potential at intervals of 1V period.

Firstly, in period t1, the control signal of the control signal main line ASW is at a high level (high), and either one of two DMX circuit TFTs in each unit circuit is selected. In this example, the thin film transistors T1a, T2a are selected. Accordingly, the video signal V1 is supplied to the first source bus line SL1 via the thin film transistor T1a, and the video signal V2 is supplied to the second source bus line SL2 via the thin film transistor T2a, whereby the first source bus line SL1 and the second source bus line SL2 are electrically charged.

In this 1V period, the video signal V1 has a positive polarity, and the video signal V2 has a negative polarity. Therefore, a video signal of a positive polarity is written in the first source bus line SL1, and a video signal of a negative polarity is written in the second source bus line SL2.

In period t2, the control signal of the control signal main line ASW is at a low level (low) and the gates of the thin film transistors T1a, T2a are off. Therefore, the potentials of the first source bus line SL1 and the second source bus line SL2 are determined.

In period t3, the control signal of the control signal main line BSW is at a high level, and the other DMX circuit TFT of each unit circuit is selected. In this example, the thin film transistors T1b, T2b are selected. Accordingly, the video signal V1 is supplied to the third source bus line SL3 via the thin film transistor T1b, and the video signal V2 is supplied to the fourth source bus line SL4 via the thin film transistor T2b, whereby the third source bus line SL3 and the fourth source bus line SL4 are electrically charged. A video signal of a positive polarity is written in the third source bus line SL3, and a video signal of a negative polarity is written in the fourth source bus line SL4.

Then, in period t4, the control signal of the control signal main line BSW is at a low level, and the gates of the thin film transistors T1b, T2b are off. Therefore, the potentials of the third source bus line SL3 and the fourth source bus line SL4 are determined.

In period t5, the potential of the control signal of the gate bus line GL(M) is at a low level, and writing of a pixel potential is completed.

The operations in periods t6 to t10 are the same as the above-described operations in periods t1 to t5. Thus, the writing operations in all the gate bus lines GL are sequentially performed as described above, and writing in all the pixel rows is completed in 1V period.

In this 1V period, the potential of the back-gate signal main line BGL(1) is fixed at a high level, and the potential of the back-gate signal main line BGL(2) is fixed at a low level. That is, the potential of the first back-gate signal which is supplied to the back-gate electrodes of the thin film transistors T1a, T1b for writing a video signal of a positive polarity in the source bus lines SL1, SL3 is higher than the potential of the second back-gate signal which is supplied to the back-gate electrodes of the thin film transistors T2a, T2b for writing a video signal of a negative polarity potential in the source bus lines SL2, SL4.

The operations in a subsequent 1V period are also basically the same as the above-described operations. Note that, however, the video signal V1 is switched to a negative polarity, and the video signal V2 is switched to a positive polarity. Accordingly, the potential of the back-gate signal main line BGL(1) is switched to a low level, and the potential of the back-gate signal main line BGL(2) is switched to a high level. Therefore, in this 1V period, a negative polarity is written in the source bus lines SL1, SL3, and a positive polarity is written in the source bus lines SL2, SL4. The potential of the first back-gate signal which is supplied to the back-gate electrodes of the thin film transistors T1a, T1b for writing a video signal of a negative polarity in the source bus lines SL1, SL3 is lower than the potential of the second back-gate signal which is supplied to the back-gate electrodes of the thin film transistors T2a, T2b for writing a video signal of a positive polarity in the source bus lines SL2, SL4.

Next, an operation of the demultiplexer circuit DMX_A based on the dot inversion driving system is described.

Figure 4:
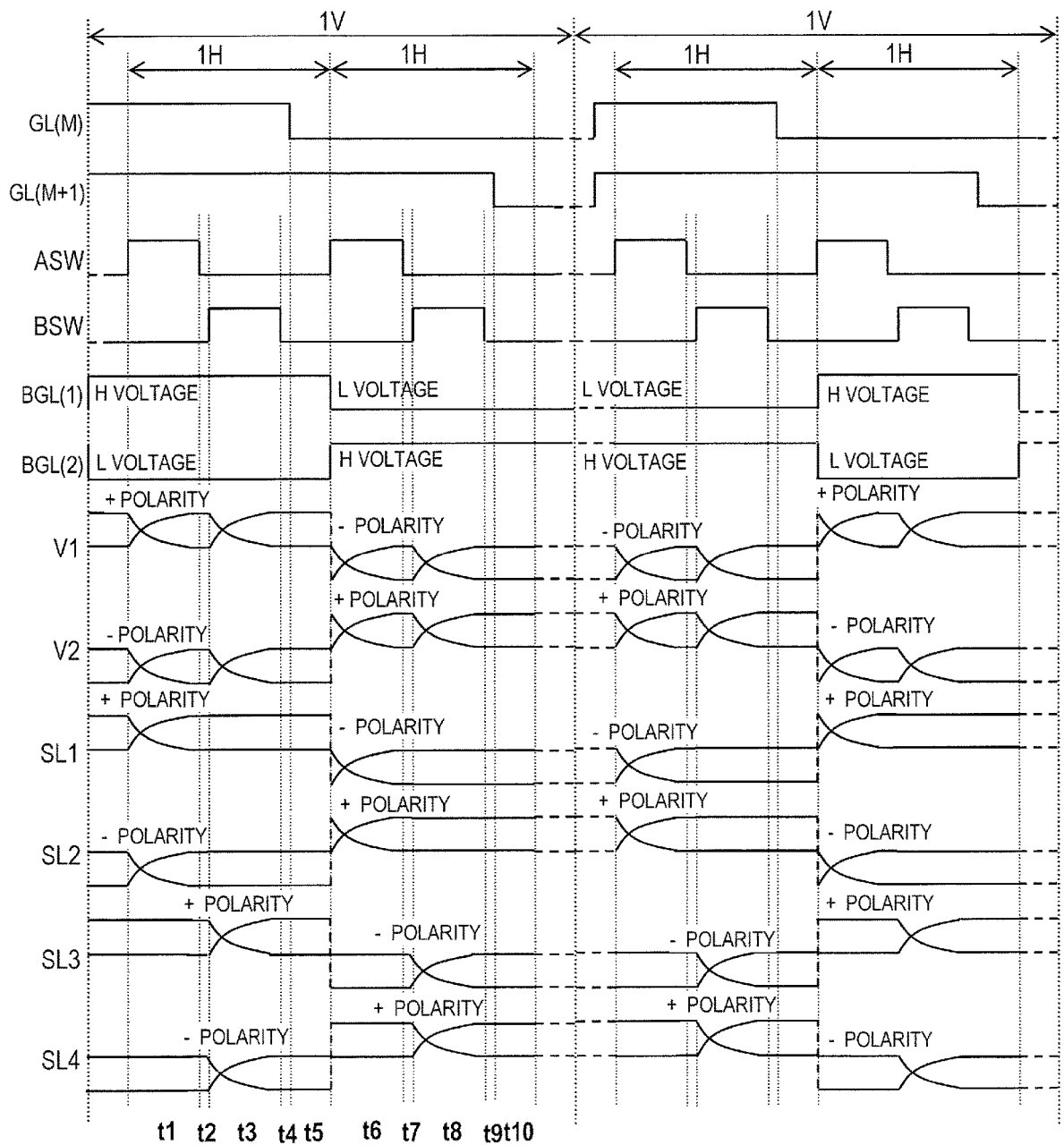
FIG. 4 is a timing chart illustrating another example of the signal waveforms in the sub-circuit 200.

FIG. 4 is a timing chart illustrating another example of the signal waveforms in the sub-circuit 200 (FIG. 2) in the demultiplexer circuit DMX_A. FIG. 4 shows an example of the signal waveforms of the gate bus lines GL, the control signal main lines ASW, BSW, the video signals V1, V2, the source bus lines SL1 to SL4, and the back-gate signal main lines BGL(1), BGL(2). Herein, only the writing operation portion in the gate bus line GL(M) of the Mth stage and the gate bus line GL(M+1) of the $(M+1)^{th}$ stage is described.

In the dot inversion driving system, the polarities of the video signals V1, V2 supplied to each source bus line SL are varied at intervals of 1H period. Accordingly, in this example, the potential of each back-gate signal main line BGL is switched at intervals of 1H period.

Specifically, in periods t1 to t5, the operations are the same as those illustrated in FIG. 3. A video signal of a positive polarity potential is written in the source bus lines SL1, SL3, and a video signal of a negative polarity potential is written in the source bus lines SL2, SL4. The potential of the back-gate signal main line BGL(1) is fixed at a high level, and the potential of the back-gate signal main line BGL(2) is fixed at a low level. That is, the potential of the first back-gate signal supplied to the back-gate electrodes of the thin film transistors T1a, T1b connected with the first and third source bus lines SL1, SL3 is higher than the potential of the second back-gate signal supplied to the back-gate electrodes of the thin film transistors T2a, T2b connected with the second and fourth source bus lines SL2, SL4.

In subsequent periods t6 to t10, a video signal of a negative polarity is written in the source bus lines SL1, SL3, and a video signal of a positive polarity is written in the source bus lines SL2, SL4. The potential of the back-gate signal main line BGL(1) is switched to a low level and fixed at the low level. Likewise, the potential of the back-gate signal main line BGL(2) is switched to a high level and fixed at the high level. That is, the potential of the first back-gate signal supplied to the back-gate electrodes of the thin film transistors T1a, T1b connected with the first and third source bus lines SL1, SL3 is lower than the potential of the second back-gate signal supplied to the back-gate electrodes of the thin film transistors T2a, T2b connected with the second and fourth source bus lines SL2, SL4.

As described above with reference to FIG. 3 and FIG. 4, in the present embodiment, the writing polarity of the source bus lines SL is varied at predetermined intervals, and accordingly, the potential of the back-gate signal of the back-gate signal main line BGL can also be switched at predetermined intervals. Specifically, the potential of a back-gate signal supplied to a thin film transistor which is to write a video signal of a positive polarity in the source bus line SL may be fixed at a high level over 1H period or 1V period, and the potential of a back-gate signal supplied to a thin film transistor in which a video signal of a negative polarity potential is to be written may be fixed at a low level over 1H period or 1V period. The period over which the potential of the back-gate signal is fixed at a high level (e.g., 1H period or 1V period) is longer than the period over which the potential of the control signal is fixed at a high level (i.e., the ON period of a selection switch in that unit circuit).

<Configuration of DMX Circuit TFT>

Next, an example of the configuration of the DMX circuit TFT of the present embodiment is described. As described above, the DMX circuit TFT has a double gate structure which includes an upper gate electrode and a lower gate electrode. In the example described herein, the DMX circuit TFT is an oxide semiconductor TFT, although the DMX circuit TFT may be a TFT of any other type, such as silicon semiconductor TFT. The active matrix substrate 1000 of the present embodiment only needs to include at least one TFT which has a double gate structure as the DMX circuit TFT and may further include a circuit TFT which has a different structure.

In an example described hereinbelow, the upper gate electrode is used as the "back-gate electrode BG", and the lower gate electrode is used as the "front-gate electrode FG". Note that the lower gate electrode may be used as the back-gate electrode, and the upper gate electrode may be used as the front-gate electrode.

Figure 5A:
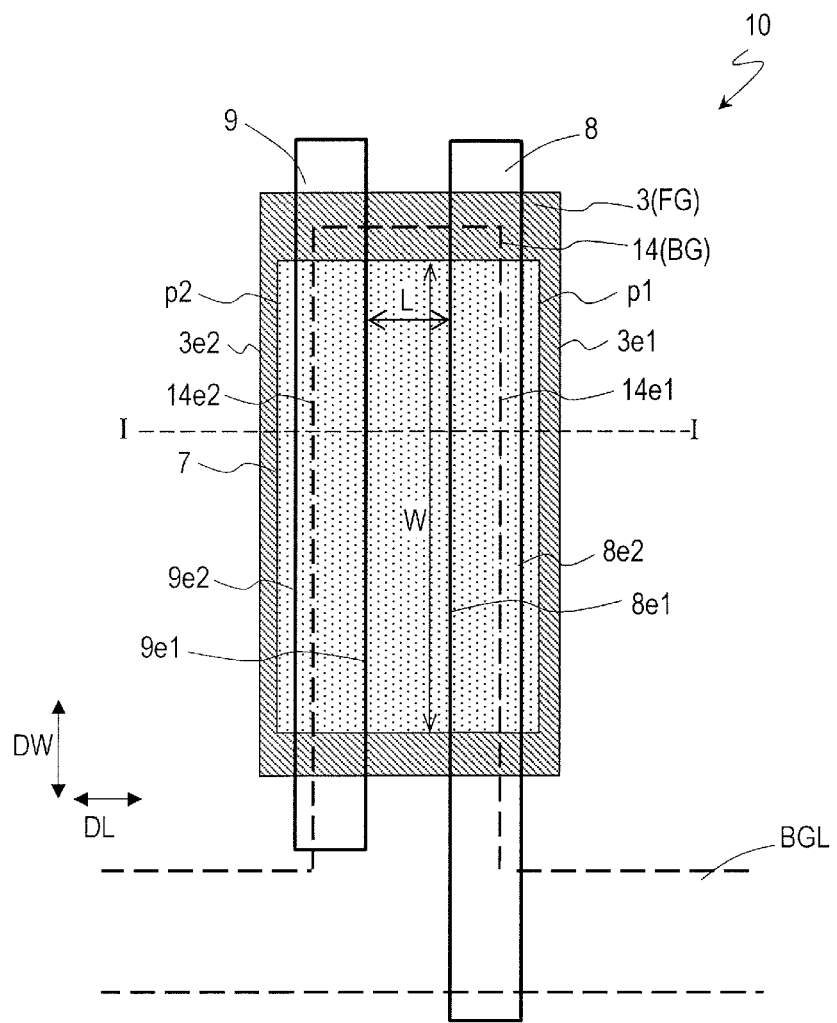
FIGS. 5A and 5B are, respectively, a plan view and a cross-sectional view illustrating a thin film transistor (DMX circuit TFT) 10 used in a demultiplexer circuit DMX.
Figure 5B:
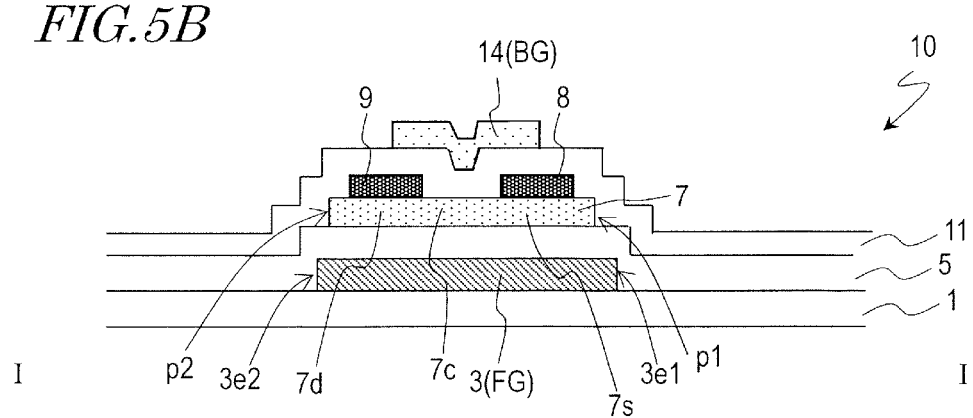

FIGS. 5A and 5B are, respectively, a plan view and a cross-sectional view of a thin film transistor 10 used as the DMX circuit TFT.

The DMX circuit TFT is supported on a substrate 1 and provided in the non-display region. The DMX circuit TFT includes a lower gate electrode 3 provided on the substrate 1, a gate insulating layer (also referred to as "first insulating layer") 5 covering the lower gate electrode 3, an oxide semiconductor layer 7, a source electrode 8 and a drain electrode 9. The oxide semiconductor layer 7 is provided on the gate insulating layer 5 so as to at least partially overlap the lower gate electrode 3 with the gate insulating layer 5 interposed therebetween. Herein, the lower gate electrode 3 is the front-gate electrode FG.

The source electrode 8 is provided on the oxide semiconductor layer 7 and is in contact with part of the oxide semiconductor layer 7. The drain electrode 9 is provided on the oxide semiconductor layer 7 and is in contact with another part of the oxide semiconductor layer 7. A part of the oxide semiconductor layer 7 which is in contact with the source electrode 8 is referred to as "source contact region 7s", and a part of the oxide semiconductor layer 7 which is in contact with the drain electrode 9 is referred to as "drain contact region 7d". When viewed in the normal direction of the substrate 1, a region lying between the source contact region 7s and the drain contact region 7d and overlapping the lower gate electrode 3 is referred to as "the channel region 7c". In the present embodiment, the oxide semiconductor layer 7 includes end portions p1, p2 opposing each other in the channel length direction. The source contact region 7s is provided on the end portion p1 side of the channel region 7c, and the drain contact region 7d is provided on the end portion p2 side of the channel region 7c. In this specification, in a plane parallel to the substrate 1, a direction DL parallel to the direction of an electric current flowing through the channel region 7c is referred to as "channel length direction", and a direction DW perpendicular to the channel length direction DL is referred to as "channel length direction". A length of the channel region 7c along the channel length direction DL is "channel length L", and a length of the channel region 7c along the channel width direction DW is "channel width W".

The DMX circuit TFT further includes an upper gate electrode 14 as the back-gate electrode BG. The upper gate electrode 14 is provided on the oxide semiconductor layer 7 with an inorganic insulating layer 11 (also referred to as "second insulating layer") interposed therebetween. When viewed in the normal direction of the substrate 1, the upper gate electrode 14 at least partially overlaps the oxide semiconductor layer 7.

The upper gate electrode 14 is electrically coupled with any of the back-gate signal main lines BGL. The back-gate signal main line BGL may be provided in a source metal layer, a gate metal layer, or any other electrically-conductive layer. In this example, the back-gate signal main line BGL and the upper gate electrode 14 are integrally formed using the same electrically-conductive film. The back-gate signal main line BGL and the upper gate electrode 14 may be provided in different layers. In this case, a contact portion may be provided for connecting together the back-gate signal main line BGL and the upper gate electrode 14.

The inorganic insulating layer 11 may be arranged so as to be in contact with the upper surfaces of the source electrode 8 and the drain electrode 9 and with the channel region 7c of the oxide semiconductor layer 7. The inorganic insulating layer 11 resides between the upper gate electrode 14 and the oxide semiconductor layer 7 and functions as a gate insulating film.

In the present embodiment, the source electrode 8 and the drain electrode 9 are formed using the same electrically-conductive film as the source bus lines SL (FIG. 1). A layer which is formed using the same electrically-conductive film as the source bus lines SL is referred to as "source metal layer". The lower gate electrode 3 is formed using the same electrically-conductive film as the gate bus lines GL (FIG. 1). A layer which is formed using the same electrically-conductive film as the gate bus lines GL is referred to as "gate metal layer".

Figure 16:
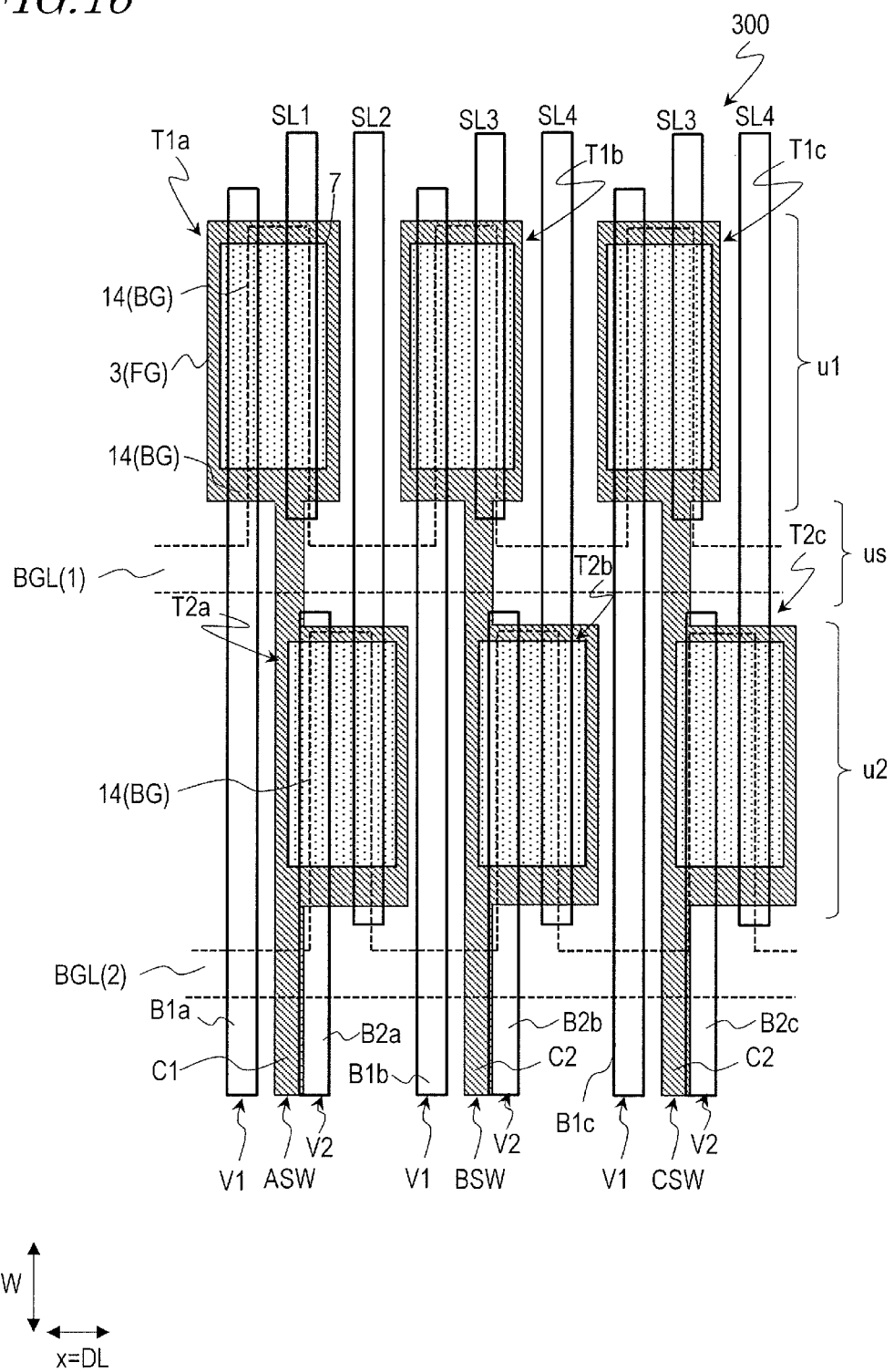
FIG. 16 is a plan view illustrating a layout of the sub-circuit 300.

In an active matrix substrate applied to a display device of a transverse electric field mode, a lower transparent electrode and an upper transparent electrode are provided in the display region with a dielectric layer interposed between the electrodes (see FIG. 16). One of the lower transparent electrode and the upper transparent electrode is the pixel electrode PE, and the other is the common electrode CE. In this case, the upper gate electrode 14 can be formed using the same transparent electrically-conductive film (e.g., In—Zn—O) as the lower transparent electrode or the upper transparent electrode. When the upper gate electrode 14 is formed using the same transparent electrically-conductive film as the lower transparent electrode, the inorganic insulating layer 11 which is a passivation film can function as the gate insulating film. When the upper gate electrode 14 is formed using the same transparent electrically-conductive film as the upper transparent electrode, the inorganic insulating layer 11 and the dielectric layer can function as the gate insulating film.

The lower gate electrode 3 includes a first edge portion 3e1 and a second edge portion 3e2 which oppose each other when viewed in the normal direction of the substrate 1, and the first edge portion 3e1 and the second edge portion 3e2 may extend generally in the channel width direction DW. The lower gate electrode 3 may be a part of the control signal branch line C extending in the channel width direction DW. When viewed in the normal direction of the substrate 1, the oxide semiconductor layer 7 may be present inside the perimeter of the lower gate electrode 3.

When viewed in the normal direction of the substrate 1, the source electrode 8 may extend across the oxide semiconductor layer 7 in the channel width direction DW. As illustrated, each of opposing edge portions 8e1, 8e2 of the source electrode 8 may be present on the oxide semiconductor layer 7. Likewise, the drain electrode 9 may extend across the oxide semiconductor layer 7 in the channel width direction DW. Each of opposing edge portions 9e1, 9e2 of the drain electrode 9 may be present on the oxide semiconductor layer 7. When viewed in the normal direction of the substrate 1, the upper gate electrode 14 includes two edge portions 14e1, 14e2 opposing each other and extending in the channel width direction WD. The edge portions 14e1, 14e2 may extend across the oxide semiconductor layer 7 generally in the channel width direction DW.

<Effects of Present Embodiment

Hereinafter, the effects achieved by controlling the signal voltage supplied to the back-gate electrode of the DMX circuit TFT are described using experimental results.

(i) Manufacture of TFT for Evaluation

As a TFT for evaluation, a double gate structure TFT 10d which has a back gate and a single gate structure TFT 10s which does not have a back gate were manufactured.

Figure 6A:
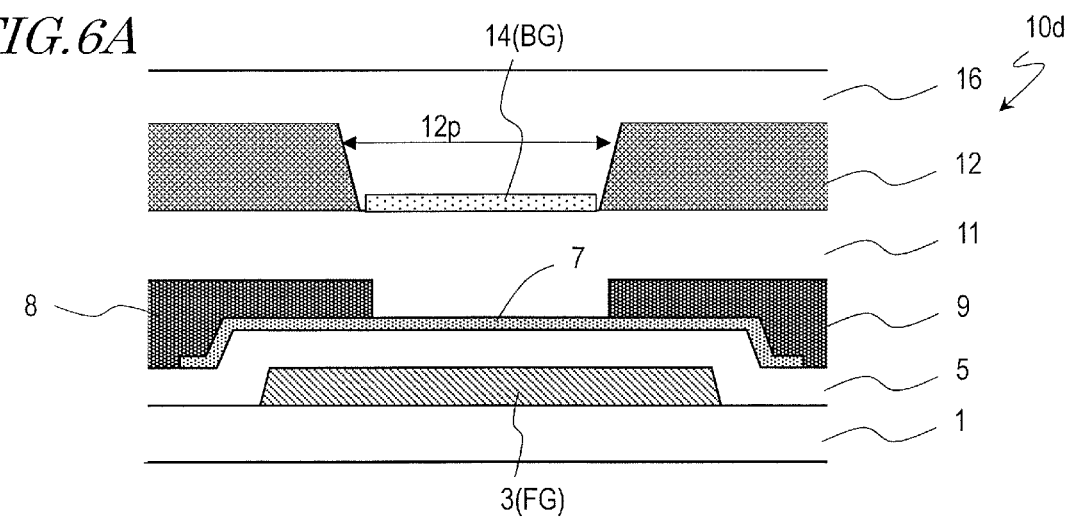
FIGS. 6A and 6B are cross-sectional views showing a TFT 10d for evaluation which has a double gate structure and a TFT 10s for evaluation which has a single gate structure, respectively.
Figure 6B:
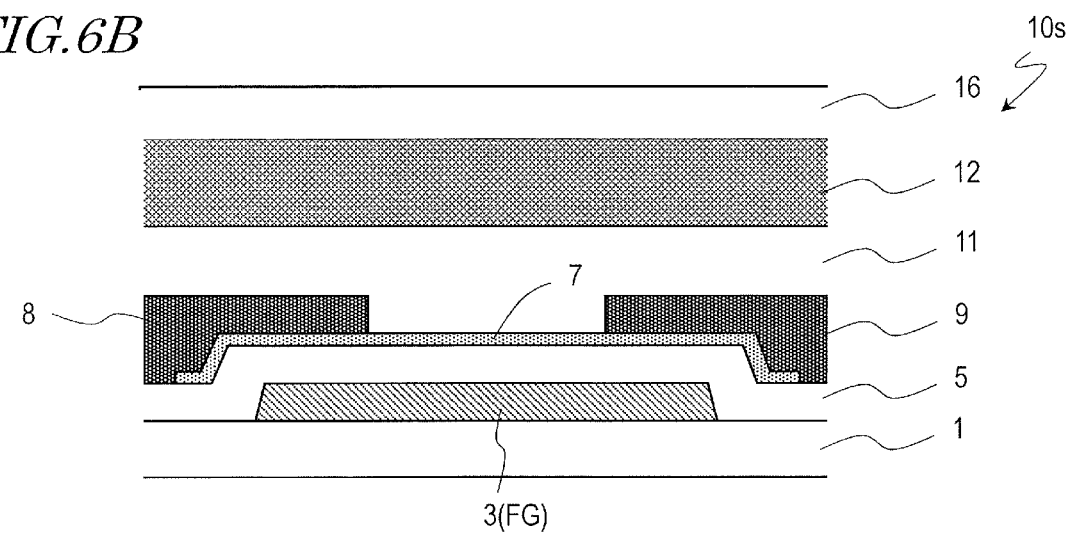

FIGS. 6A and 6B are cross-sectional views showing the double gate structure TFT 10d and the single gate structure TFT 10s, respectively. In FIGS. 6A and 6B, the same components as those of FIGS. 5A and 5B are designated with the same reference numerals. In either TFT, the channel length L was 6 μm, and the channel width W was 10 μm.

The double gate structure TFT 10d has the configuration which has previously been described with reference to FIGS. 5A and 5B. Note that, however, an organic insulating layer 12 is provided as a flattening film on the inorganic insulating layer 11. The organic insulating layer 12 has an opening 12p which reaches the inorganic insulating layer 11. The upper gate electrode 14 is provided inside the opening 12p and is arranged so as to be in contact with the inorganic insulating layer 11 inside the opening 12p. The upper gate electrode 14 may extend from the inside of the opening 12p so as to overlie part of the organic insulating layer 12. On the organic insulating layer 12 and the upper gate electrode 14, an upper insulating layer 16 is provided. The lower gate electrode 3 is the front-gate electrode FG. The upper gate electrode 14 is the back-gate electrode BG.

The single gate structure TFT 10s is different from the double gate structure TFT 10d in that the single gate structure TFT 10s is covered with the inorganic insulating layer 11 and the organic insulating layer 12 and does not include the upper gate electrode 14.

(ii) Threshold Voltage Vth of Double Gate Structure TFT 10d

In the double gate structure TFT 10d, the change of the Vg-Id characteristic (initial characteristic) was examined with varying back-gate voltages (backgate-source voltages) Vbg. Herein, a voltage of 20 V was applied between the source and the drain (Vds=20 V), and the drain current Id was measured when the back-gate voltage Vbg was −4 V, −2 V, 0 V, 2 V, and 4 V.

Figure 7A:
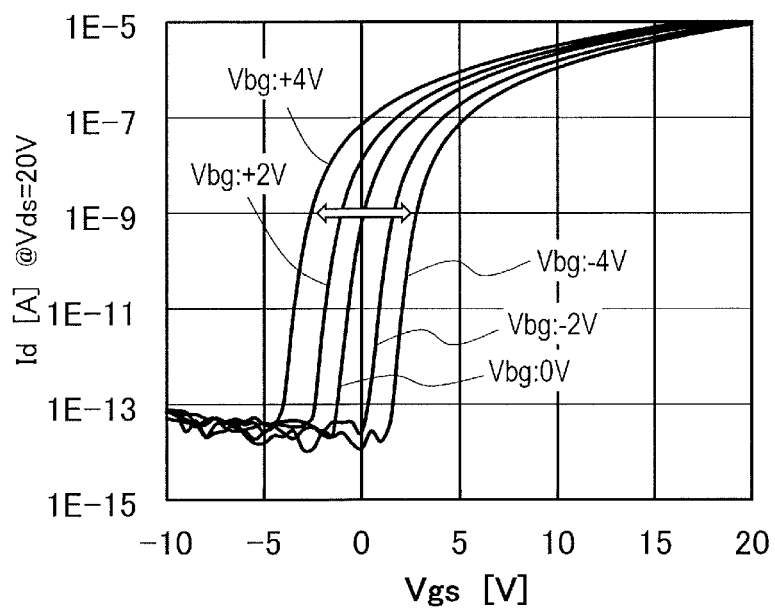
FIG. 7A is a graph showing the dependence of the Vg-Id characteristic on the back-gate voltage Vbg.

FIG. 7A is a graph showing the dependence of the Vg-Id characteristic on the back-gate voltage Vbg. The horizontal axis represents the gate-source voltage (gate voltage) Vgs. The vertical axis represents the drain current Id. From these results, it is seen that the threshold voltage Vth can be controlled by controlling the back-gate voltage Vbg. It is seen that as the back-gate voltage Vbg is increased in the positive direction, the threshold voltage Vth decreases, and the ON current can be increased with the same gate voltage Vgs.

Figure 7B:
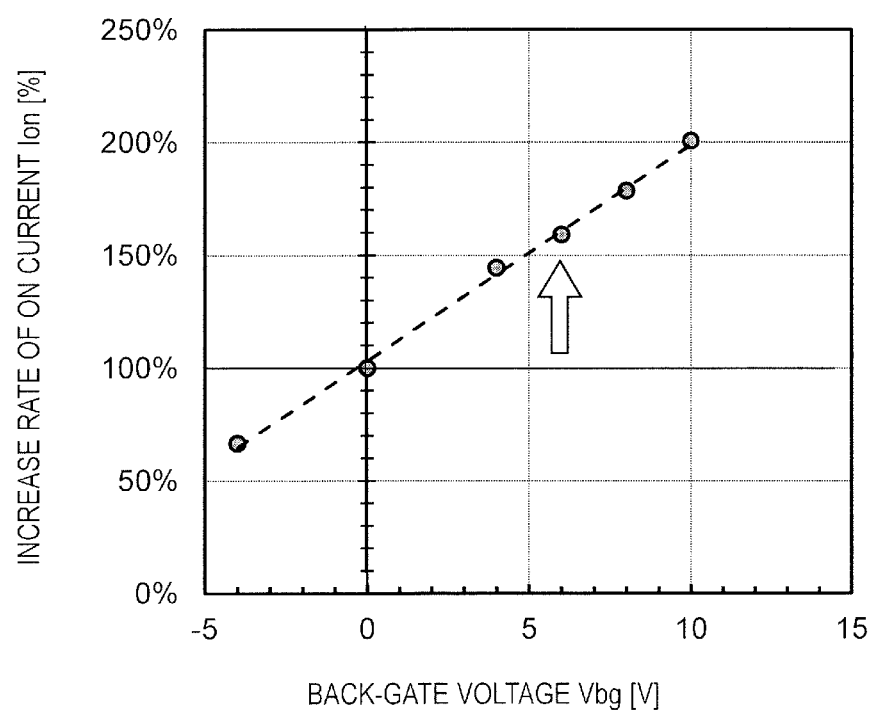
FIG. 7B is a graph showing the relationship between the back-gate voltage Vbg and the increase rate of the ON current.

FIG. 7B is a graph showing the relationship between the back-gate voltage Vbg and the increase rate of the ON current (%). Herein, the ON current was measured when the gate voltage Vgs was 10 V and Vds was 0.1 V. The increase rate of the ON current is the rate with respect to the ON current at Vbg=0 (V). In this example, it is seen that the ON current increases 1.5 times at the back-gate voltage Vbg=6 (V). When the ON current increases 1.5 times, the channel width of the TFT can be reduced to 2/3. For example, when the channel width of the TFT is reduced from 300 μm to 200 μm, the width of the non-display region (frame region) can be reduced by 0.1 mm and the driving power can be reduced to 2/3.

(iii) Stress Breakdown Voltage of Double Gate Structure TFT 10d

Firstly, the relationship between the presence/absence of the back gate and the stress breakdown voltage of the TFT was examined.

Figure 8A:
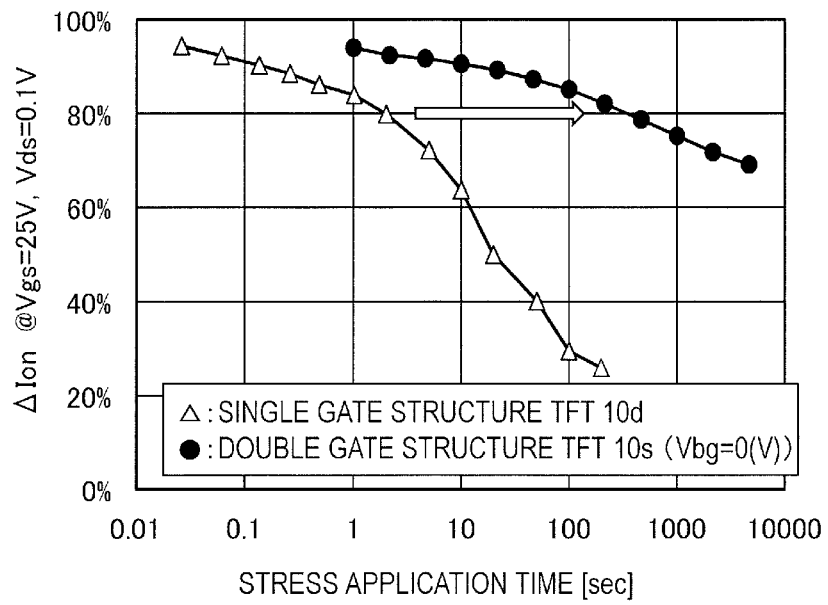
FIG. 8A is a graph showing the relationship between the Vds stress application time and the ON current in the double gate structure TFT 10d and the single gate structure TFT 10s.

FIG. 8A is a graph showing the relationship between the Vds stress application time and the ON current. The horizontal axis represents the application time of the Vds stress (sec). The vertical axis represents the ratio of the ON current after application of the Vds stress with respect to the initial ON current of each TFT before application of the Vds stress, ΔIon (%). The back-gate voltage (backgate-source voltage) Vbg in the double gate structure TFT 10d was 0 V.

From these measurement results, it is seen that in the single gate structure TFT 10s, the ON current greatly decreased due to the Vds stress, and deterioration occurred. On the other hand, in the double gate structure TFT 10d, the decrease of the ON current due to the Vds stress is greatly suppressed as compared with the single gate structure TFT 10s. Comparing the stress application times which cause the ratio with respect to the initial ON current, ΔIon, to be 80%, the breakdown voltage was improved by about two orders of magnitude. Therefore, it is seen that the breakdown voltage against the Vds stress of the TFT can be improved by providing a back gate.

Next, the breakdown voltage against the Vds stress was examined with varying back-gate voltages Vbg.

Figure 8B:
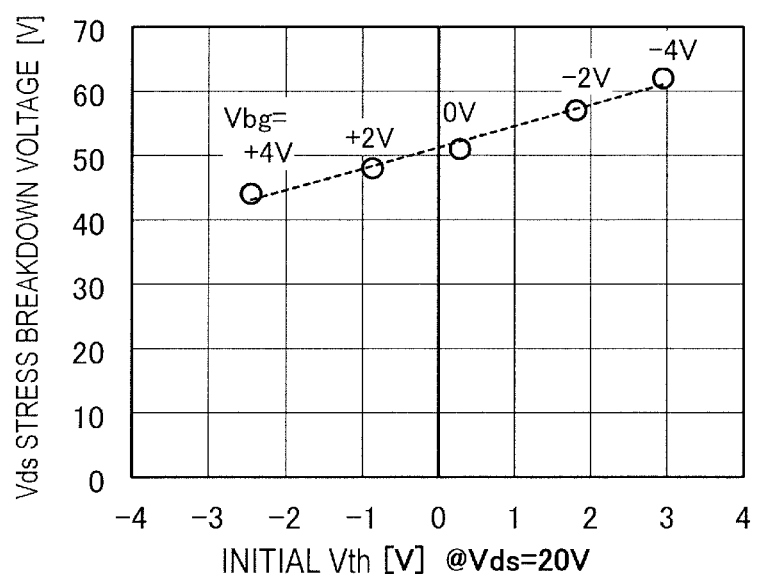
FIG. 8B is a graph showing the dependence of the Vds stress breakdown voltage on the back-gate voltage Vbg.

FIG. 8B is a graph showing the dependence of the Vds stress breakdown voltage on the back-gate voltage Vbg. The horizontal axis represents the initial threshold voltage Vth when Vd=20 V (see FIG. 8A). From these results, it is seen that as the back-gate voltage Vbg is increased in the positive direction, the initial threshold voltage Vth decreases, but the Vds stress breakdown voltage disadvantageously decreases.

Next, a PBT stress test was carried out for more specifically examining the relationship between the back-gate voltage and the stress breakdown voltage of the double gate structure TFT.

Figure 9A:
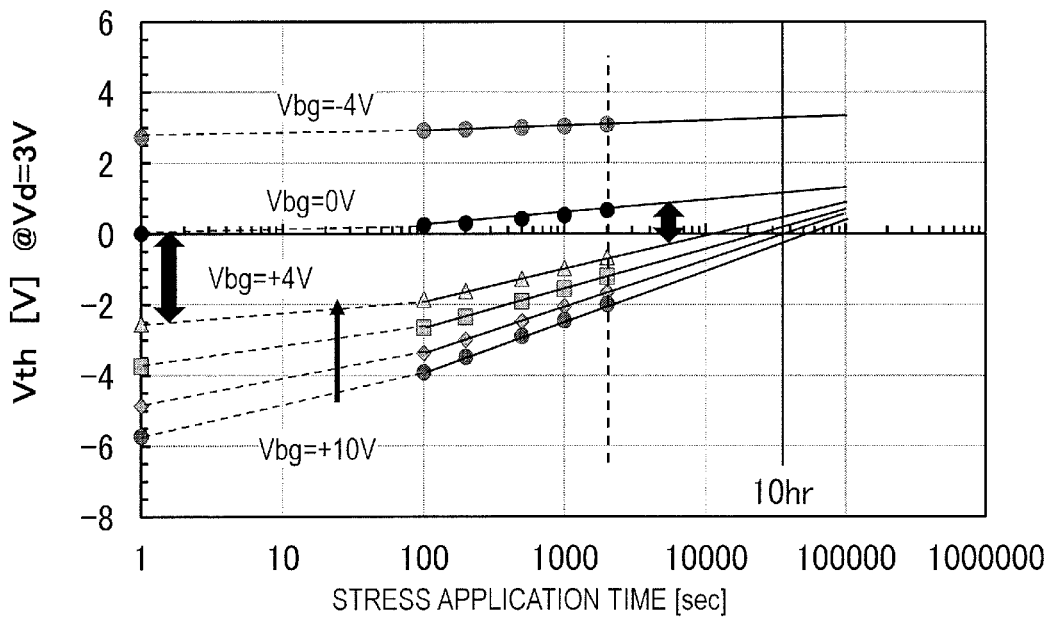
FIG. 9A is a graph showing the relationship between the back-gate voltage Vbg and the variation of the threshold voltage Vth due to PBT stress in the double gate structure TFT.
Figure 9B:
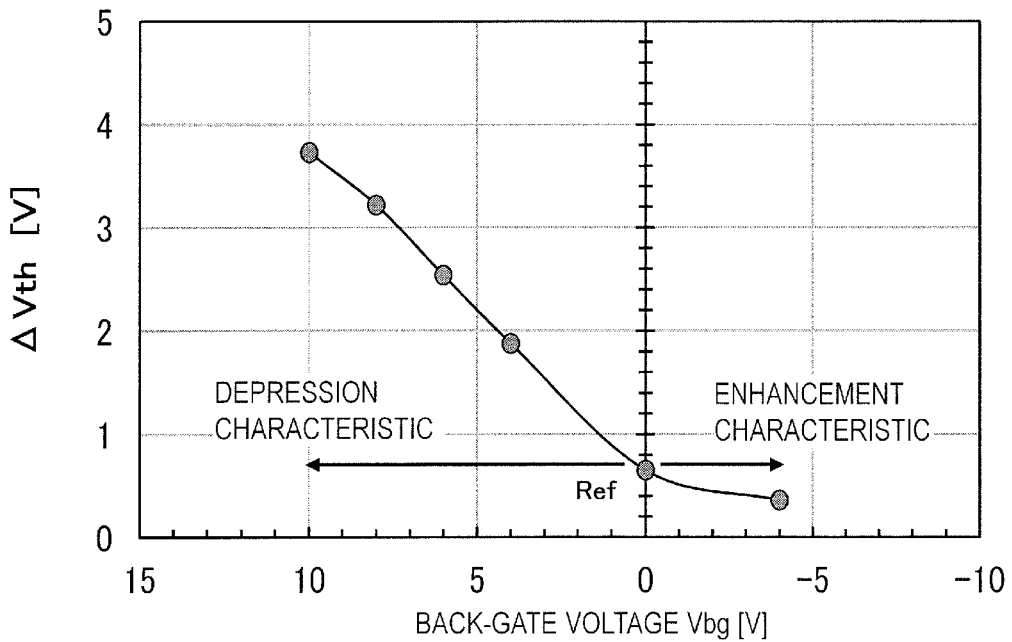
FIG. 9B is a graph showing the relationship between the back-gate voltage Vbg and the shift amount ΔVth of the threshold voltage due to application of PBT stress in the double gate structure TFT.

FIGS. 9A and 9B are graphs showing the results of a PBT stress (positive bias temperature stress) test on the double gate structure TFT. In measurement, a double gate structure TFT used had the configuration shown in FIG. 6A. Note that the channel length L was 4 μm, and the channel width W was 20 μm.

FIG. 9A is a graph showing the relationship between the back-gate voltage Vbg of the double gate structure TFT and the variation of the threshold voltage Vth due to the PBT stress. FIG. 9B is a graph showing the relationship between the back-gate voltage Vbg of the double gate structure TFT and the shift amount ΔVth of the threshold voltage due to the PBT stress. The shift amount ΔVth on the vertical axis means the difference between a threshold voltage in an early phase of the stress test and a threshold voltage after application of the PBT stress for 2000 seconds.

As seen from FIG. 9A, in the early phase of the stress test, application of a positive bias to the back gate (back-gate voltage Vbg>0) causes the threshold voltage to effectually shift in the negative direction, so that the operation margin increases. However, as the stress application time increases, the threshold voltage gradually increases (becomes closer to the threshold voltage of the back-gate voltage Vbg=0), so that the operation margin decreases. This is probably because the amount of deterioration due to the PBT stress increased, and the effect achieved by application of the back-gate voltage Vbg decreased.

As seen from FIG. 9B, as the back-gate voltage Vbg increases, the shift amount ΔVth of the threshold voltage due to the PBT stress increases. It is understood from this that, as the back-gate voltage Vbg increases, the deterioration amount due to the PBT stress increases.

As seen from the experimental results of (ii) and (iii), when the signal voltage supplied to the back gate is set such that the back-gate voltage Vbg is greater than 0 (V), the drivability of the thin film transistor can be effectively improved. The back-gate voltage Vbg may be, for example, not less than +2 V or not less than +4 V. On the other hand, as the back-gate voltage Vbg increases, the deterioration due to the voltage stress increases. As a result, there is a probability that the effect achieved by application of the back-gate voltage Vbg (the effect of effectually negatively shifting the threshold voltage) will decrease or that the reliability of the TFT will decrease.

On the other hand, according to the present embodiment, by controlling the potential of the back-gate signal supplied to the back-gate electrode of the DMX circuit TFT, the back-gate voltage Vbg, which is the difference between the potential of the back-gate signal and the potential of the video signal, can be adjusted so as to be within a predetermined range. Also, the potential of the back-gate signal can be varied according to the polarity of the video signal supplied to the source electrode of the DMX circuit TFT. For example, when the video signal has a negative polarity, the potential of the back-gate signal is set lower than when the video signal has a positive polarity, so that the deterioration of the DMX circuit TFT due to the voltage stress can be suppressed, and the effect achieved by application of the back-gate voltage Vbg can be more assuredly realized.

Hereinafter, the effects achieved by the present embodiment are specifically described with reference to the drawings.

Figure 10A:
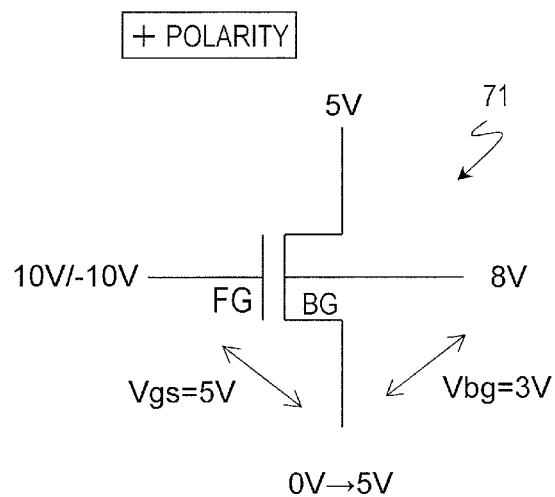
FIGS. 10A and 10B illustrate a reference example of the control of the back-gate voltage Vbg.
Figure 10B:
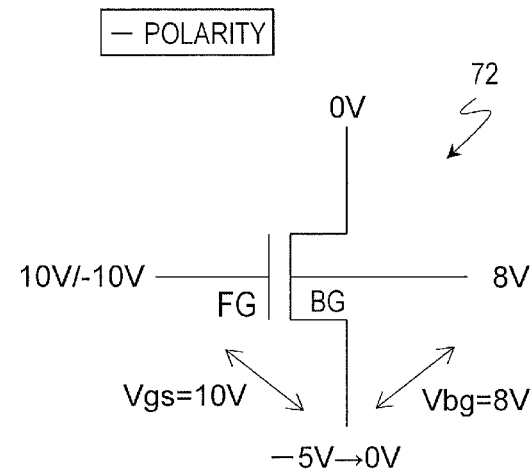
Figure 11A:
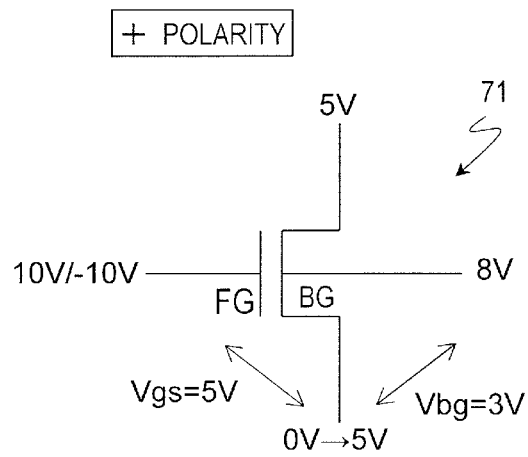
FIGS. 11A and 11B show Example 1 of the control of the back-gate voltage Vbg.
Figure 11B:
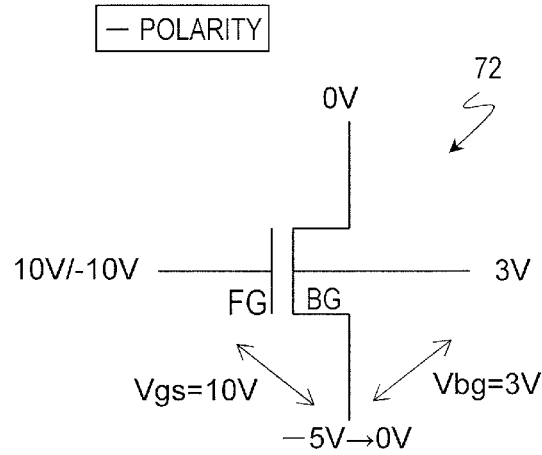

Increasing the potential of a source bus line SL connected with a DMX circuit TFT from a low potential to a high potential (e.g., in the positive polarity range, from 0 V to +5 V; in the negative polarity range, from −5 V to 0 V) is referred to as "worst case". FIGS. 10A and 10B and FIGS. 11A and 11B show a reference example and Example 1, respectively, of the control of the back-gate voltage Vbg in the worst case. FIG. 10A and FIG. 11A show a DMX circuit TFT 71 where a video signal of a positive polarity is supplied to the source bus line SL, and the potential of the source bus line SL is increased from 0 V to +5 V. FIG. 10B and FIG. 11B show a DMX circuit TFT 72 where a video signal of a negative polarity is supplied to the source bus line SL, and the potential of the source bus line SL is increased from −5 V to 0 V.

In the reference example shown in FIGS. 10A and 10B, back-gate signals of the same voltage (herein, 8 V) are supplied to the back-gate electrodes of the DMX circuit TFTs 71, 72 irrespective of the writing polarity. The back-gate voltages (backgate-source voltages) Vbg in the DMX circuit TFTs 71, 72 are 3 V and 8 V, respectively. That is, when a video signal of a negative polarity is written, the back-gate voltage Vbg is greater than when a video signal of a positive polarity is written. Therefore, there is a probability that the deterioration of the DMX circuit TFT 72 due to the voltage stress will increase.

On the other hand, in Example 1 shown in FIGS. 11A and 11B, the signal voltages applied to the back-gate electrodes of the DMX circuit TFTs 71, 72 are made different according to the writing polarity. Herein, a voltage of 8 V is applied to the back-gate electrode of the DMX circuit TFT 71, and a voltage of 3 V is applied to the back-gate electrode of the DMX circuit TFT 72. The back-gate voltages Vbg of the DMX circuit TFTs 71, 72 are 3 V irrespective of the writing polarity. Therefore, the back-gate voltage Vbg of the DMX circuit TFT 72 can be smaller than in the reference example, so that the deterioration due to the voltage stress can be suppressed. When a video signal of a negative polarity is written, the gate voltage (frontgate-source voltage) Vgs is sufficiently high (herein, Vbg=10 V) and, therefore, sufficient drivability can be secured even if the voltage applied to the back-gate electrode is decreased.

As described above, by setting the potential of the back-gate signal supplied to the DMX circuit TFT 72 lower than the potential of the back-gate signal supplied to the DMX circuit TFT 71, the drivability can be improved while reducing the voltage stress on the DMX circuit TFTs.

In Example 1 described above, the back-gate voltages Vbg of the DMX circuit TFTs 71, 72 are equal, although these values may be different. The potential of the back-gate signal supplied to the DMX circuit TFT 72 is lower than the potential of the back-gate signal supplied to the DMX circuit TFT 71 and can be appropriately set such that the back-gate voltage Vbg of the DMX circuit TFT 72 is greater than 0 V (positive bias).

<Layout Example of Demultiplexer Circuit DMX_A>

Figure 12:
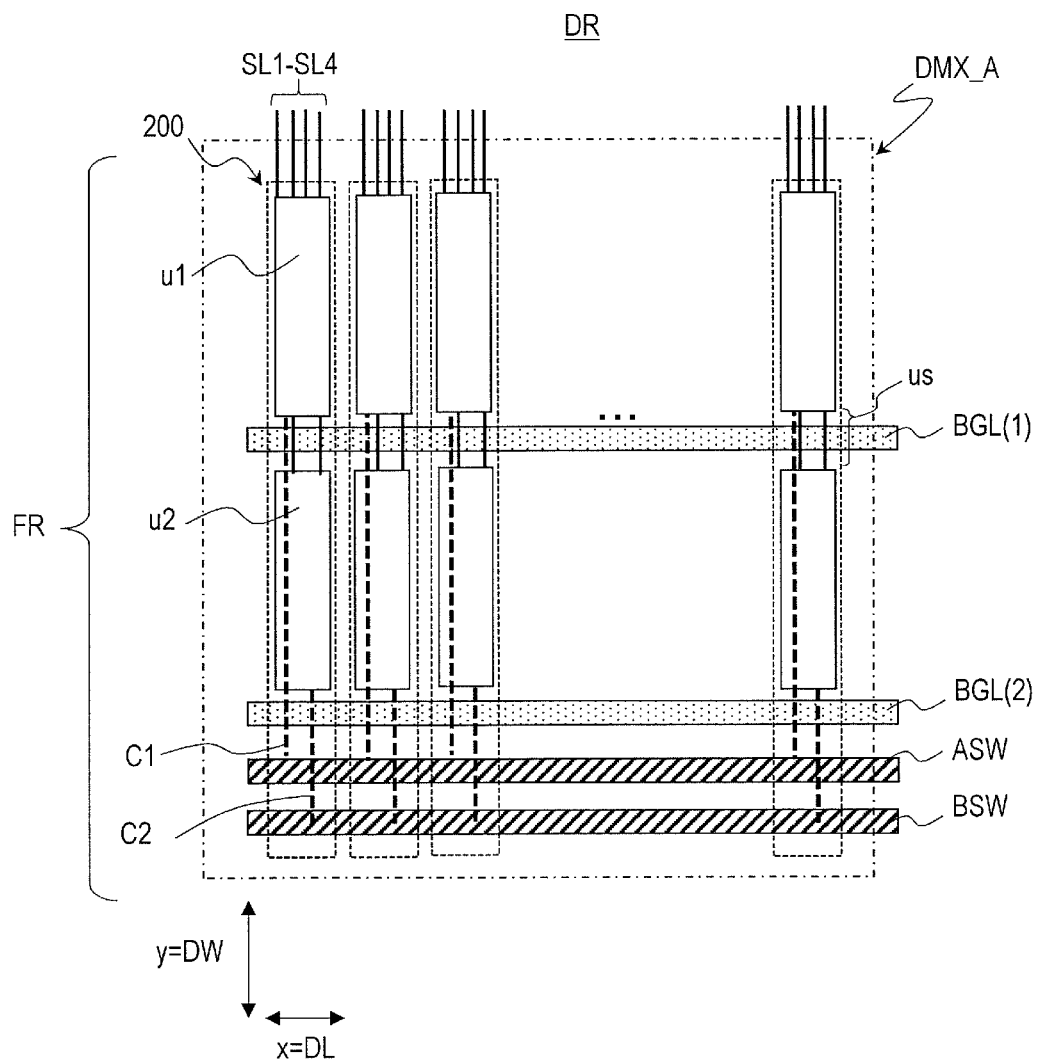
FIG. 12 is a plan view illustrating a layout of a demultiplexer circuit DMX_A.

FIG. 12 is a plan view showing an example of the layout of the demultiplexer circuit DMX_A of the present embodiment. The demultiplexer circuit DMX_A includes a plurality of sub-circuits 200. Each of the sub-circuits 200 includes the first unit circuit and the second unit circuit as previously described with reference to FIG. 2. Each of the first unit circuit and the second unit circuit is associated with two source bus lines SL (i.e., n=2).

The demultiplexer circuit DMX_A is provided under the display region DR when viewed in the normal direction of the substrate 1. In this example, in the demultiplexer circuit DMX_A, the plurality of sub-circuits 200 are arranged in the x direction. Each of the sub-circuits 200 has a shape elongated in the y direction.

When each of the sub-circuits 200 is viewed in the normal direction of the substrate 1, the first unit circuit formation region u1 in which the DMX circuit TFT of the first unit circuit is provided is located on the display region side of the second unit circuit formation region u2 in which the DMX circuit TFT of the second unit circuit is provided. That is, the first unit circuit resides between the second unit circuit and the display region. In this specification, such a configuration is referred to as "two-stage configuration".

The control signal main lines ASW, BSW are provided between the demultiplexer circuit DMX_A and the perimeter of the non-display region FR. The control signal main lines ASW, BSW may extend in the x direction. Although not shown, a COG-mounted driving circuit and a video signal line are provided between the demultiplexer circuit DMX_A and the perimeter of the non-display region FR.

The back-gate signal main line BGL(1) extends near the respective first unit circuits in the x direction. The back-gate signal main line BGL(2) extends near the respective second unit circuits in the x direction. As shown in the drawing, the back-gate signal main line BGL(1) may be provided in a region us between the first unit circuit formation regions u1 and the second unit circuit formation regions u2 (hereinafter, referred to as "connecting region us"), and the back-gate signal main line BGL(2) may be provided on the lower side of the second unit circuit formation regions u2 (on a side opposite to the display region). Alternatively, the back-gate signal main line BGL(1) may be provided on the display region side of the first unit circuit formation regions u1, and the back-gate signal main line BGL(2) may be provided in the connecting region us (or on the lower side of the second unit circuit formation regions u2). When at least one of the back-gate signal main lines BGL is provided in the connecting region us, the increase of the circuit area of the demultiplexer circuit DMX can be suppressed. Although not shown, the back-gate signal main line BGL(1) includes protrusions which protrude toward the respective first unit circuit formation regions u1 and which function as the upper gate electrodes. Likewise, the back-gate signal main line BGL(2) includes protrusions which protrude toward the respective second unit circuit formation regions u2 and which function as the upper gate electrodes. The back-gate signal main lines BGL(1), BGL(2) may extend so as to traverse the first unit circuit formation regions u1 and the second unit circuit formation regions u2, respectively.

The arrangement of the back-gate signal main lines BGL(1), BGL(2) is not limited to the example shown in the drawing. The back-gate signal main lines BGL(1), BGL(2) and the upper gate electrodes 14 of the respective thin film transistors may be formed using different electrically-conductive films. For example, back-gate signal branch lines which include the upper gate electrodes 14 of the respective thin film transistors may be formed in a transparent electrically-conductive layer, and the back-gate signal main lines BGL(1), BGL(2) may be formed in an electrically-conductive layer of lower resistance, such as a gate metal layer. In this case, a contact portion is provided for electrically coupling together the back-gate signal main lines BGL(1), BGL(2) and corresponding back-gate signal branch lines.

Figure 13:
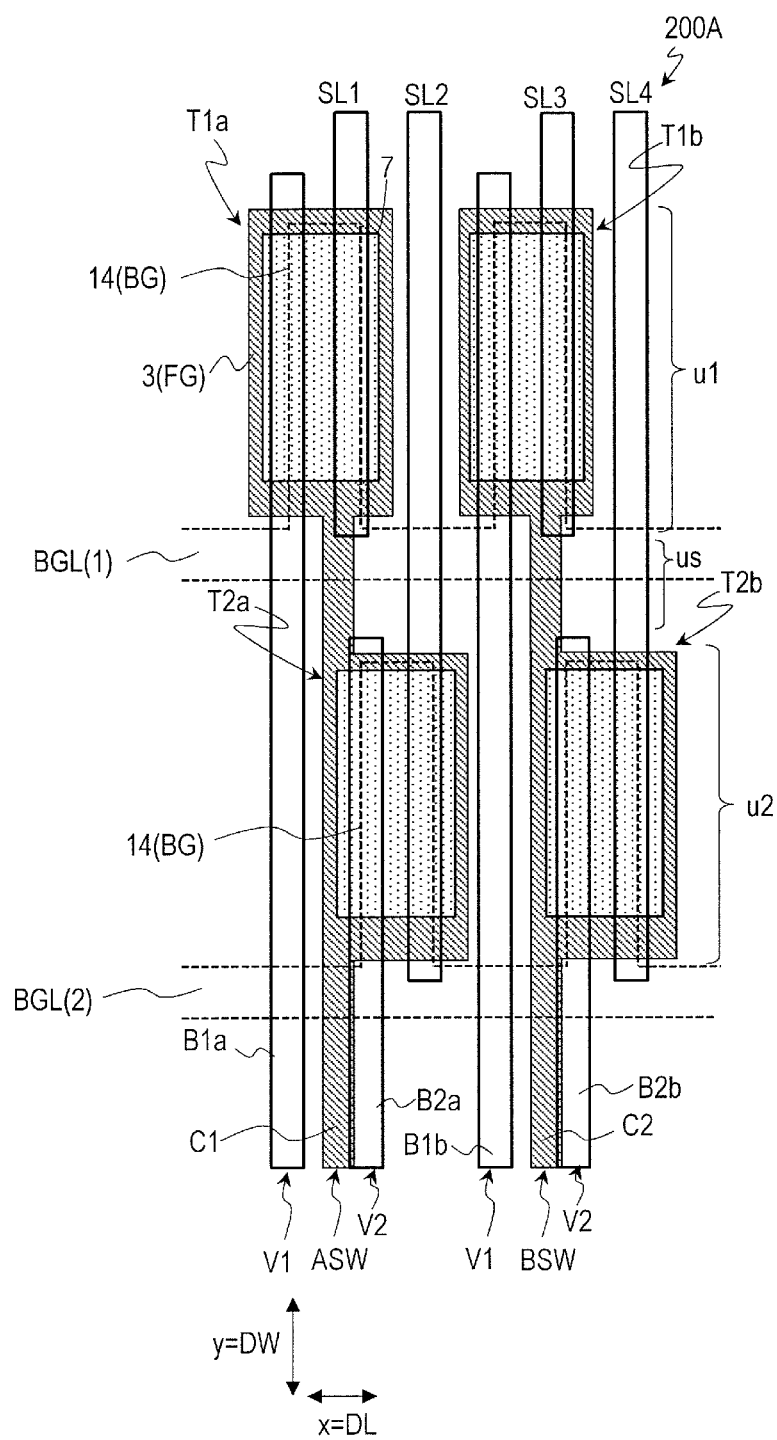
FIG. 13 is a plan view illustrating a layout of a sub-circuit 200A in the demultiplexer circuit DMX_A.

FIG. 13 is an enlarged plan view illustrating a layout of a sub-circuit 200A in the demultiplexer circuit DMX_A.

The first unit circuit includes thin film transistors T1a, T1b provided in the first unit circuit formation regions u1 and branch lines B1a, B1b. The second unit circuit includes thin film transistors T2a, T2b provided in the second unit circuit formation regions u2 and branch lines B2a, B2b. The first and second unit circuits further include common control signal branch lines C1, C2. The control signal branch lines C1, C2 are electrically coupled with the control signal main lines ASW, BSW, respectively.

The branch lines B1a, B2a, B1b, B2b (also generically referred to as "branch lines B"), the control signal branch lines C1, C2 and the source bus lines SL1 to SL4 of the first unit circuit and the second unit circuit each extend in the y direction. The back-gate signal main lines BGL(1), BGL(2) each extend in the x direction. In this example, in each thin film transistor, the channel length direction DL is generally parallel to the x direction, and the channel width direction DW is generally parallel to the y direction.

The control signal branch lines C1, C2 each include a portion which functions as the gate electrode of a corresponding DMX circuit TFT. For example, the control signal branch line C1 resides between the branch line B1a and the branch line B2a when viewed in the normal direction of the substrate 1. The control signal branch line C1 includes protrusions which protrude in the x direction to the branch line B2a side and which function as the gate electrodes of the thin film transistors T2a and protrusions which protrude in the x direction to the branch line B2a side and which function as the gate electrodes of the thin film transistors T1a. The oxide semiconductor layers 7 of the thin film transistor T1a and the thin film transistor T2a are respectively provided on these protrusions of the control signal branch line C1. That is, one of the DMX circuit TFTs in the first unit circuit and one of the DMX circuit TFTs in the second unit circuit have gate electrodes which are integrally formed with an identical control signal branch line C, and are provided on the identical control signal branch line C so as to be spaced away from each other (two-stage configuration).

The branch lines B and the video signal lines DO may be provided in the source metal layer. The lower gate electrode 3 and the control signal main lines SW may be provided in the gate metal layer. The upper gate electrode 14 and the back-gate signal main lines BGL may be provided in a transparent electrically-conductive layer which is formed using the same electrically-conductive film as the pixel electrode or common electrode. The upper gate electrode 14 may be integrally formed with a corresponding back-gate signal main line BGL.

The upper gate electrode 14 of each thin film transistor is connected with a corresponding back-gate signal main line BGL. Herein, the back-gate signal main lines BGL(1), BGL(2) extend in the x direction so as not to overlap the first unit circuit formation regions u1 and the second unit circuit formation regions u2, respectively. The back-gate signal main line BGL(1) may include protrusions which function as the back-gate electrodes BG of the thin film transistors T1a, T1b in the first unit circuit. Likewise, the back-gate signal main line BGL(2) may include protrusions which function as the back-gate electrodes BG of the thin film transistors T2a, T2b in the second unit circuit. Although not shown, the back-gate signal main line BGL(1) may include portions which extend across the first unit circuit formation regions u1 and which function as the back-gate electrodes BG of the thin film transistors T1a, T1b in the first unit circuit. Likewise, the back-gate signal main line BGL(2) may include portions which extend across the second unit circuit formation regions u2 and which function as the back-gate electrodes BG of the thin film transistors T2a, T2b in the first unit circuit.

The source bus lines SL1 to SL4 each include a portion which are in contact with the oxide semiconductor layer 7 of corresponding DMX circuit TFTs and which functions as the drain electrode. For example, the first source bus line SL1 extends in the y direction from the display region DR and is in contact with the upper surface of the oxide semiconductor layer 7 of the thin film transistor T1a. The second source bus line SL2 extends in the y direction from the display region DR through a gap between the thin film transistor T1a and the thin film transistor T1b and is in contact with the upper surface of the oxide semiconductor layer 7 of the thin film transistor T2a.

Each of the branch lines B1a, B2a, B1b, B2b includes a portion which is in contact with the oxide semiconductor layer 7 of a corresponding DMX circuit TFT and which functions as the source electrode. For example, the branch line B2a extends in the y direction from the COG side and is in contact with the upper surface of the oxide semiconductor layer 7 of the thin film transistor T2a. The branch line B1b extends in the y direction from the COG side through a gap between the thin film transistor T2a and the thin film transistor T2b and is in contact with the upper surface of the oxide semiconductor layer 7 of the thin film transistor T1b.

When viewed in the normal direction of the substrate 1, the DMX circuit TFT of the first unit circuit is provided between the $N^{th}$ and $(N+2)^{th}$ source bus lines SL associated with the second unit circuit (N is a natural number). For example, the thin film transistor T1b is provided between the second source bus line SL2 and the fourth source bus line SL4. The DMX circuit TFT of the second unit circuit is provided between two adjoining branch lines B in the first unit circuit. For example, the thin film transistor T2a is provided between the branch lines B1a, B1b of the first unit circuit.

The demultiplexer circuit DMX_A may be covered with an inorganic insulating layer (passivation film) 11 (see FIGS. 5A and 5B). On the inorganic insulating layer 11, a flattening film such as the organic insulating layer 12 (see FIGS. 6A and 6B) may be provided or may not be provided. For example, over the active matrix substrate 1000, the display region DR may be covered with the organic insulating layer 12, and the non-display region FR may not be covered with the organic insulating layer 12. The organic insulating layer 12 may be provided so as to cover the demultiplexer circuit DMX, and a part of the organic insulating layer 12 lying above the thin film transistor may have an opening (see FIGS. 6A and 6B).

In the present embodiment, in each DMX circuit TFT, the drain electrode is part of the source bus line SL, the source electrode is part of the branch line B, and the gate electrode is part of the control signal branch line C. Further, a control signal branch line C which is common to two or more unit circuits is provided. Due to this configuration, the area required for the demultiplexer circuit DMX can be effectively reduced. By increasing the channel width W in the y direction, the current drivability can be further improved.

Further, since in the present embodiment a plurality of unit circuits are arranged according to the two-stage configuration, a DMX circuit TFT of a desired size can be formed even if the arrangement pitch of the source bus lines SL is decreased. If a plurality of unit circuits are arranged according to the single-stage configuration, the necessity to provide a DMX circuit TFT between two adjoining source bus lines SL can arise. On the other hand, in the present embodiment, a DMX circuit TFT only needs to be provided between, for example, the $N^{th}$ source bus line SL and the $(N+2)^{th}$ source bus line SL and, therefore, a highly-reliable DMX circuit TFT which has a desired channel length and a desired overlapping length can be formed. Thus, the present embodiment is also suitably applicable to an active matrix substrate of high resolution, e.g., exceeding 1000 ppi. By monolithically forming a demultiplexer circuit DMX in which an oxide semiconductor is used, the area of wire and terminal regions in the non-display region can be reduced and, therefore, narrowing of the frame can be realized.

Although an example of the two-stage configuration has been described herein, a configuration of three or more stages can be employed. Also in such a case, as in the above-described example, each sub-circuit may include three or more unit circuits, and the DMX circuit TFTs of these unit circuits may be provided on a common control signal branch line so as to be spaced away from one another.

Figure 14:
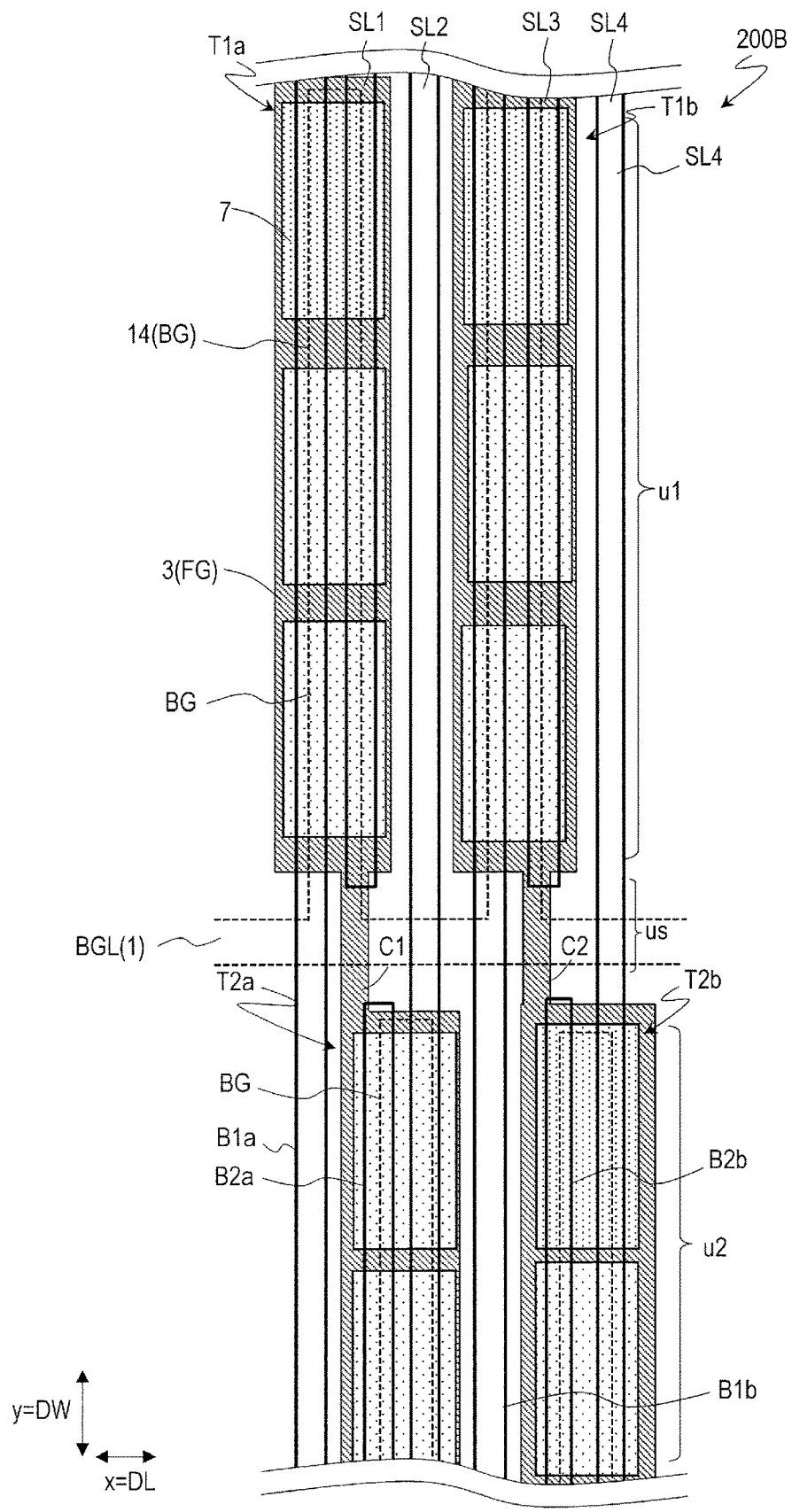
FIG. 14 is a plan view illustrating a layout of another sub-circuit 200B in the demultiplexer circuit DMX_A.

FIG. 14 is a plan view illustrating part of another sub-circuit 200B in the demultiplexer circuit DMX_A.

The sub-circuit 200B is different from the sub-circuit 200A shown in FIG. 13 in that a plurality of thin film transistors connected in parallel are provided for a single source bus line SL.

In this example, a plurality of thin film transistors T1a connected in parallel with one another are connected with, for example, the first source bus line SL1. These thin film transistors T1a are arranged in the y direction on the control signal branch line C1 and include a part of the control signal branch line C1 as the gate electrode, a part of the branch line B1a as the source electrode, and a part of the first source bus line SL1 as the drain electrode. Likewise, with each of the other source bus lines SL1 to SL4, a plurality of thin film transistors T2a, T1b, T2b connected in parallel with one another are connected. Due to such a configuration, the current drivability can be further improved while suppressing increase of the circuit area.

In the sub-circuit 200B, a common upper gate electrode 14 is provided for a plurality of thin film transistors arranged in the y direction. The common upper gate electrode 14 may extend in the y direction. Each of the common upper gate electrodes 14 is connected with a corresponding back-gate signal main line BGL.

(Other Variations)

In the foregoing, the description has been presented with an example of the demultiplexer circuit DMX_A in which each unit circuit is associated with two source bus lines (n=2). However, the unit circuit of the demultiplexer circuit of the present embodiment may be associated with three or more source bus lines (n=3).

Figure 15:
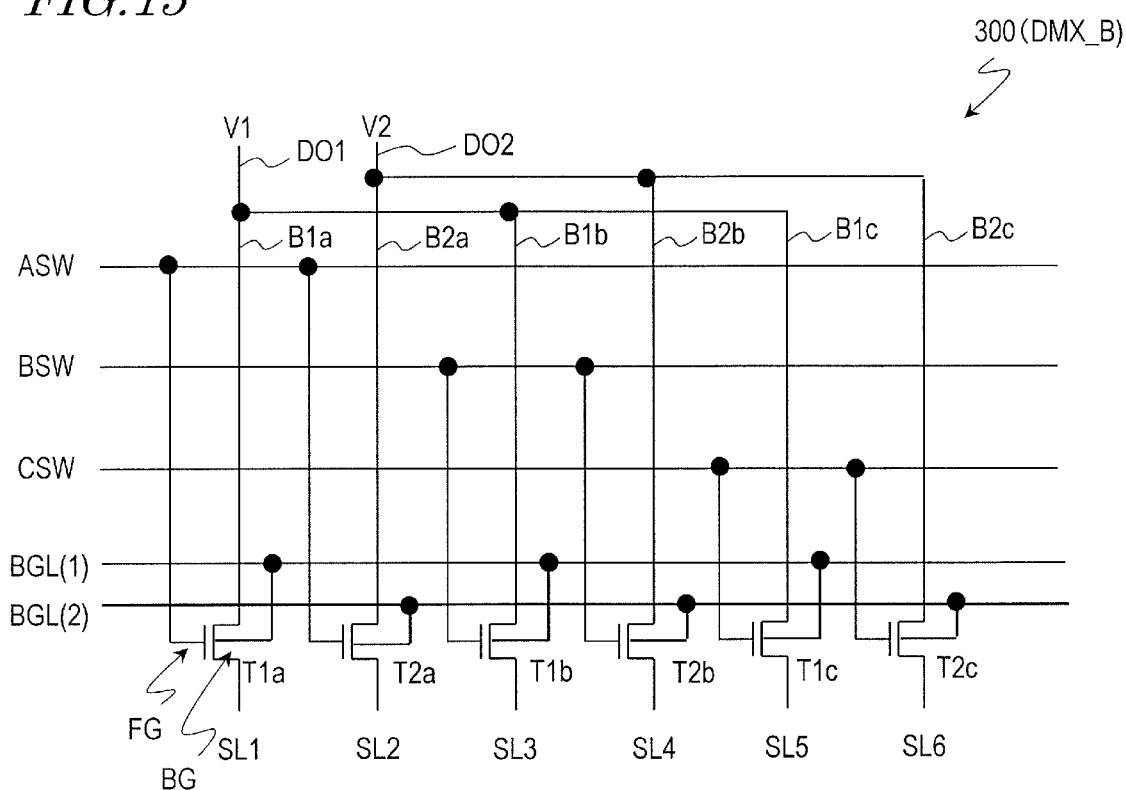
FIG. 15 is a diagram showing a configuration of a sub-circuit 300 of a demultiplexer circuit DMX_B.

FIG. 15 is a diagram showing a configuration of a sub-circuit 300 in an alternative demultiplexer circuit DMX_B of the present embodiment.

The demultiplexer circuit DMX_B includes a plurality of sub-circuits 300 and three control signal main lines ASW, BSW, CSW.

The sub-circuit 300 includes the first unit circuit and the second unit circuit as does the above-described sub-circuit 200. However, the sub-circuit 300 is different from the sub-circuit 200 shown in FIG. 2 in that each unit circuit distributes a video signal V1 from a video signal line DO(N) to three source bus lines SL which occur in every other source bus line.

The first unit circuit is associated with the first, third and fifth source bus lines SL1, SL3, SL5 which occur in every other source bus line. The second unit circuit is associated with the second, fourth and sixth source bus lines SL2, SL4, SL6 which occur in every other source bus line. Herein, the first, third and fifth source bus lines SL1, SL3, SL5 are the first polarity source bus lines. The second, fourth and sixth source bus lines SL2, SL4, SL6 are the second polarity source bus lines which are supplied with a video signal of the opposite polarity to the polarity of a video signal supplied to the first polarity source bus lines.

The first unit circuit includes three thin film transistors (DMX circuit TFTs) T1a, T1b, Tc and three branch lines B1a, B1b, B1c. The second unit circuit includes three thin film transistors (DMX circuit TFTs) T2a, T2b, T2c and three branch lines B2a, B2b, B2c. The branch lines B1a, B1b, B1c of the first unit circuit are electrically coupled with the video signal line DO1. The branch lines B2a, B2b, B2c of the second unit circuit are electrically coupled with the video signal line DO2. In the first unit circuit, the drain electrodes of the thin film transistors T1a, T1b, T1c are connected with the first source bus line SL1, the third source bus line SL3, and the fifth source bus line SL5, respectively. The source electrodes of the thin film transistors T1a, T1b, T1c are connected with the branch lines B1a, B1b, B1c, respectively. In the second unit circuit, the drain electrodes of the thin film transistors T2a, T2b, T2c are connected with the second source bus line SL2, the fourth source bus line SL4, and the sixth source bus line SL6, respectively. The source electrodes of the thin film transistors T2a, T2b, T2c are connected with the branch lines B2a, B2b, B2c, respectively. The gate electrodes of the thin film transistors T1a, T2a are connected with the control signal main line ASW. The gate electrodes of the thin film transistors T1b, T2b are connected with the control signal main line BSW. The gate electrodes of the thin film transistors T1c, T2c are connected with the control signal main line CSW. In the first unit circuit, the back gates of the thin film transistors T1a, T1b, T1c are connected with the back-gate signal main line BGL(1). In the second unit circuit, the back gates of the thin film transistors T2a, T2b, T2c are connected with the back-gate signal main line BGL(2).

FIG. 16 is an enlarged plan view showing an example of the layout of the demultiplexer circuit DMX_B.

In each sub-circuit 300, as in the previously-described sub-circuits 200A, 200B, the first unit circuit formation regions u1 in which the thin film transistors T1a, T1b, T1c of the first unit circuit are provided may be closer to the display region side than the second unit circuit formation regions u2 in which the thin film transistors T2a, T2b, T2c of the second unit circuit are provided.

The configuration of the demultiplexer circuit of the present embodiment is not limited to the above-described examples. For example, a control signal supplied from each control signal main line SW may be subjected to a phase evolution. Although the above-described demultiplexer circuits DMX_A, DMX_B includes n control signal main lines SW, K×n (K is an integer not less than 2) control signal main lines SW may be provided. By performing a phase evolution on the control signal of the control signal main line SW, the number of unit circuits connected with a single control signal main line SW can be reduced, and accordingly, the load on each control signal main line SW can be reduced. As a result, the transition time (rising and falling) of the control signal can be reduced and, therefore, a faster operation is possible.

Second Embodiment

The demultiplexer circuit of the second embodiment is different from the demultiplexer circuit of the first embodiment in that the potential of a control signal supplied to the front-gate electrode of a DMX circuit TFT is varied according to the writing polarity (the polarity of a video signal).

Figure 17:
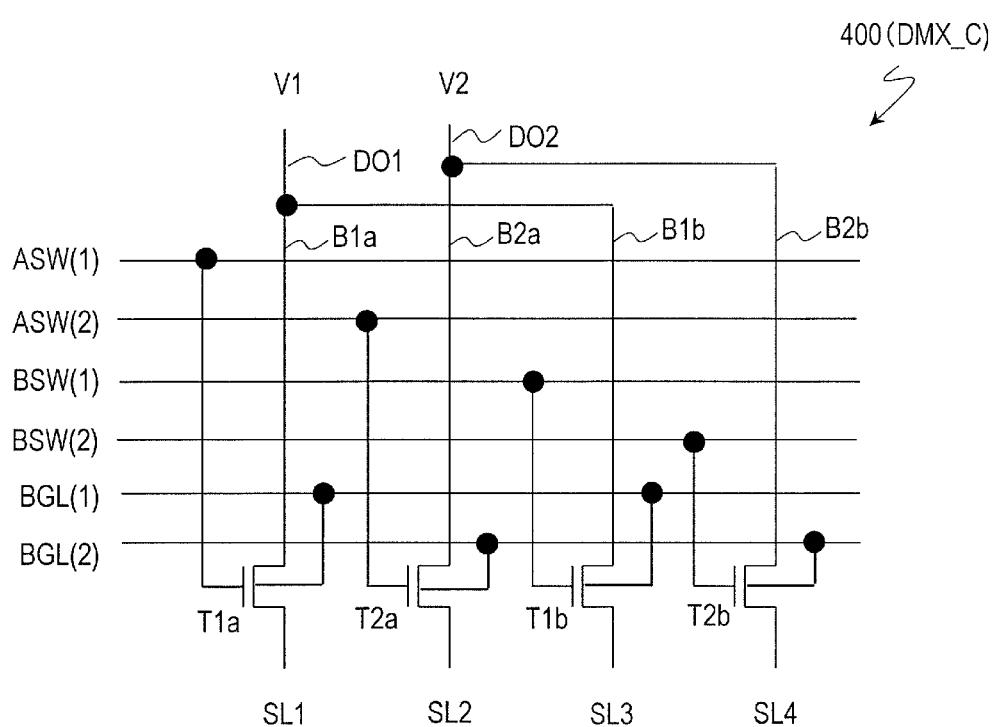
FIG. 17 is a diagram illustrating a configuration of a sub-circuit 400 of a demultiplexer circuit DMX_C of the second embodiment of the present invention.

FIG. 17 shows a single sub-circuit 400 in a demultiplexer circuit DMX_C of the present embodiment.

The sub-circuit 400 is different from the sub-circuit 200 shown in FIG. 2 in that the sub-circuit 400 includes at least n (herein, two) first control signal main lines ASW(1), BSW(1) and at least n (herein, two) second control signal main lines ASW(2), BSW(2) as a plurality of control signal main lines.

The front-gate electrode FG of each DMX circuit TFT connected with a first polarity source bus line SL to which a first video signal is to be supplied is electrically coupled with one of the first control signal main lines ASW(1), BSW(1). The front-gate electrode FG of each DMX circuit TFT connected with a second polarity source bus line SL to which a second video signal that has the opposite polarity to that of the first video signal is to be supplied is electrically coupled with one of the second control signal main lines ASW(2), BSW(2).

In this example, the sub-circuit 400 includes the first unit circuit associated with the first and third source bus lines SL1, SL3 which are the first polarity source bus lines and the second unit circuit associated with the second and fourth source bus lines SL2, SL4 which are the second polarity source bus lines.

The front-gate electrodes FG of the thin film transistors T1a, T1b of the first unit circuit are connected with the first control signal main lines ASW(1), BSW(1), respectively. The front-gate electrodes FG of the thin film transistors T2a, T2b of the second unit circuit are connected with the second control signal main lines ASW(2), BSW(2), respectively. The other constituents are the same as those of the sub-circuit 200, and the description thereof is herein omitted.

Where, in each 1V period (or 1H period), the high-level potential and the low-level potential of the control signal on one of the first control signal main line and the second control signal main line connected with a DMX circuit TFT in which a positive-polarity video signal is written are VGH1 and VGL1 and the high-level potential and the low-level potential of the control signal on the other control signal main line connected with a DMX circuit TFT in which a negative-polarity video signal is written are VGH2 and VGL2, the high-level potential VGH1 is set higher than the high-level potential VGH2 (VGH1>VGH2). Likewise, the low-level potential VGL1 may also be set higher than the low-level potential VGL2 (VGL1>VGL2).

The control signal on the first control signal main line ASW(1) and the control signal on the second control signal main line ASW(2) may be inphase signals. The control signal on one of the first control signal main line ASW(1) and the second control signal main line ASW(2) connected with a DMX circuit TFT which supplies a video signal of a positive polarity to a source bus line SL may have a waveform obtained by shifting to the high potential side the waveform of the control signal on the other control signal main line connected with a DMX circuit TFT which supplies a video signal of a negative polarity to a source bus line SL. Likewise, the control signal on the first control signal main line BSW(1) and the control signal on the second control signal main line BSW(2) are inphase signals. One of these control signals may have a waveform obtained by shifting to the high potential side the waveform of the other control signal.

The potentials VGH1/VGL1, VGH2/VGL2 of the control signals on the respective control signal main lines may be switched according to the reversal of the writing polarity at predetermined intervals (e.g., 1V period or 1H period).

Next, the operation of the demultiplexer circuit DMX_C is described.

Figure 18:
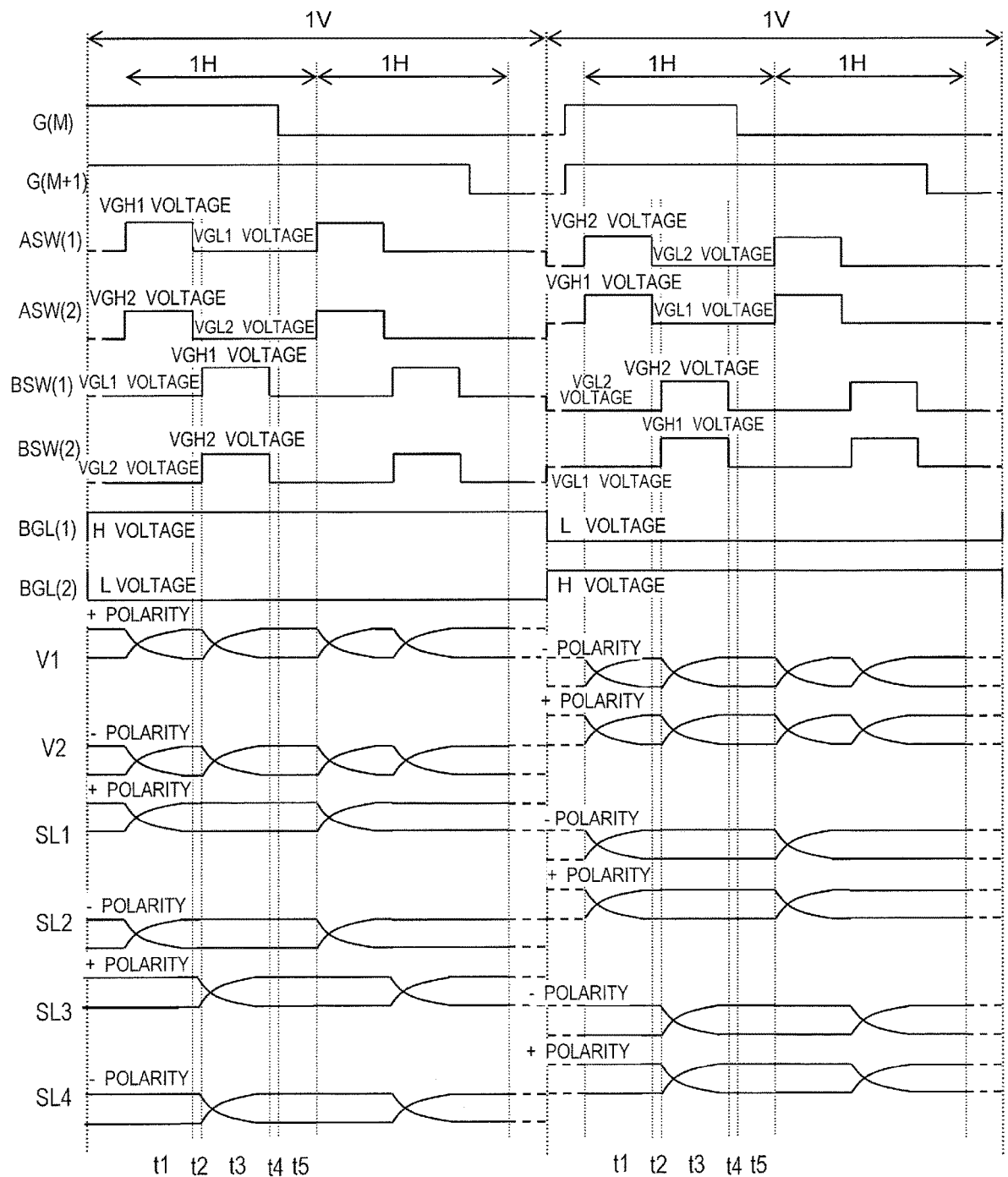
FIG. 18 is a timing chart illustrating an example of the signal waveforms in the sub-circuit 400.

FIG. 18 is a timing chart illustrating the signal waveforms in the sub-circuit 400 (FIG. 17) of the demultiplexer circuit DMX_C where the operation is carried out based on a column inversion driving system. FIG. 18 shows an example of the signal waveforms of the gate bus lines GL, the first control signal main lines ASW(1), ASW(2), the second control signal main lines BSW(1), BSW(2), the video signals V1, V2, the source bus lines SL1 to SL4, the back-gate signal main lines BGL(1), BGL(2). Herein, only the writing operation portion in the gate bus line GL(M) of the $M^{th}$ stage and the gate bus line GL(M+1) of the $(M+1)^{th}$ stage is described.

In the column inversion driving system, the writing polarity of the source bus lines SL is varied at intervals of 1V period. Correspondingly, herein, the potential of the control signal on each control signal main line and the potentials of the back-gate signals on the back-gate signal main lines BGL(1), BGL(2) are switched at intervals of 1V period.

Periods t1 to t5 represent the time of writing in the gate bus line GL(M) (1H period). Periods t6 to t10 represent the time of writing in the gate bus line GL(M+1) (1H period).

Firstly, in period t1, the control signals on the first control signal main line ASW(1) and the second control signal main line ASW(2) are at high levels (high), and one of the DMX circuit TFTs in each unit circuit is selected. The control signals on the first control signal main line ASW(1) and the second control signal main line ASW(2) are inphase signals. The control signal on the first control signal main line ASW(1) is set to high-level potential VGH1 while the control signal on the second control signal main line ASW(2) is set to high-level potential VGH2 (VGH1>VGH2).

In this example, the thin film transistors T1a, T2a are selected. Accordingly, the video signal V1 is supplied to the first source bus line SL1 via the thin film transistor T1a, and the video signal V2 is supplied to the second source bus line SL2 via the thin film transistor T2a, whereby the first source bus line SL1 and the second source bus line SL2 are electrically charged. In this 1V period, the video signal V1 has a positive polarity, and the video signal V2 has a negative polarity.

In period t2, the control signals on the first control signal main line ASW(1) and the second control signal main line ASW(2) are at low levels (low). The control signal on the first control signal main line ASW(1) is set to low-level potential VGL1 while the control signal on the second control signal main line ASW(2) is set to low-level potential VGL2 (VGL1>VGL2). As a result, the gates of the thin film transistors T1a, T2a are off and, therefore, the potentials of the first source bus line SL1 and the second source bus line SL2 are determined.

In period t3, the control signals on the first control signal main line BSW(1) and the second control signal main line BSW(2) are at high levels, and the other DMX circuit TFT of each unit circuit is selected. The control signals on the first control signal main line BSW(1) and the second control signal main line BSW(2) are inphase signals. The control signal on the first control signal main line BSW(1) is set to high-level potential VGH1 while the control signal on the second control signal main line BSW(2) is set to high-level potential VGH2.

In this example, the thin film transistors T1b, T2b are selected. Accordingly, a video signal of a positive polarity V1 is supplied to the second source bus line SL2 via the thin film transistor T1b, and a video signal of a negative polarity V2 is supplied to the fourth source bus line SL4 via the thin film transistor T2b, whereby the second source bus line SL2 and the fourth source bus line SL4 are electrically charged.

Then, in period t4, the control signals on the first control signal main line BSW(1) and the second control signal main line BSW(2) are at low levels. The control signal on the second control signal main line BSW(1) is set to low-level potential VGL1 while the control signal on the second control signal main line BSW(2) is set to low-level potential VGL2. As a result, the gates of the thin film transistors T1a, T2a are off and, therefore, the potentials of the third source bus line SL3 and the fourth source bus line SL4 are determined.

In period t5, the potential of the control signal on the gate bus line GL(M) is at a low level, and writing of a pixel potential is completed.

The operations in periods t6 to t10 are the same as the above-described operations in periods t1 to t5. Thus, the writing operations in all the gate bus lines GL are sequentially performed as described above, and writing in all the pixel rows is completed in 1V period.

In this 1V period, as in the previously-described embodiment, the back-gate signal main line BGL(1) connected with the back-gate electrodes of the thin film transistors T1a, T1b which supply a video signal of a positive polarity to the first and third source bus lines SL1, SL3 is fixed at a high level. The back-gate signal main line BGL(2) connected with the back-gate electrodes of the thin film transistors T2a, T2b which supply a video signal of a negative polarity to the second and fourth source bus lines SL2, SL4 is fixed at a low level.

The operations in a subsequent 1V period are also basically the same as the above-described operations. Note that, however, the video signal V1 is switched to a negative polarity, and the video signal V2 is switched to a positive polarity. Therefore, a negative polarity is written in the first and third source bus lines SL1, SL3, and a positive polarity is written in the second and fourth source bus lines SL1, SL4. According to the reversal of the polarity of the video signals, the potentials of the control signals on the first control signal main lines ASW(1), BSW(1) are switched to VGH2/VGL2, and the potentials of the control signals on the second control signal main lines ASW(2), BSW(2) are switched to VGH1/VGL1. Further, the potential of the back-gate signal on the back-gate signal main line BGL(1) is switched to a low level, and the potential of the back-gate signal on the back-gate signal main line BGL(2) is switched to a high level.

Although not shown, when the operations are carried out based on the dot inversion driving system, the polarities of the video signals V1, V2 are varied at intervals of 1H period. Correspondingly, the potentials of each back-gate signal main line BGL and the control signal main lines SW may be switched at intervals of 1H period (see FIG. 4).

According to the present embodiment, the voltage applied to the front-gate electrode (the potential of the control signal) is also controlled according to the writing polarity. Specifically, in writing a positive polarity, the potential of the control signal supplied to the front-gate electrode (at least the high-level potential) is higher than in writing a negative polarity. This allows the gate voltage Vgs in writing a positive polarity to be increased and, therefore, the drivability can be further improved.

The above-described effects can be achieved by making at least the high-level potential of the control signal higher in writing a positive polarity than in writing a negative polarity. For example, only the high-level potential may be varied according to the writing polarity while the low-level potential is constant. Alternatively, in writing a positive polarity, the low-level potential may be increased by the increase of the high-level potential. As a result, irrespective of the writing polarity, the amplitude (the difference between the high-level potential and the low-level potential) is constant and, therefore, the increase of the power consumption can be suppressed.

By controlling the voltage applied to the back-gate electrode (the potential of the back-gate signal) according to the writing polarity, sufficient back-gate voltage Vbg can be secured while suppressing the deterioration due to the voltage stress as in the first embodiment. Thus, the effectual threshold voltage of the TFT can be decreased and, therefore, the writing performance can be improved.

Hereinafter, an example of the control of the gate voltage Vgs and the back-gate voltage Vbg in the worst case is described.

Figure 19A:
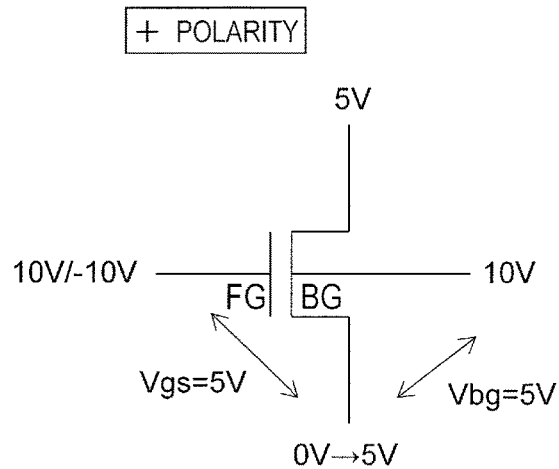
FIGS. 19A and 19B illustrate Example 2 of the control of the back-gate voltage Vbg and the front-gate voltage Vgs.
Figure 19B:
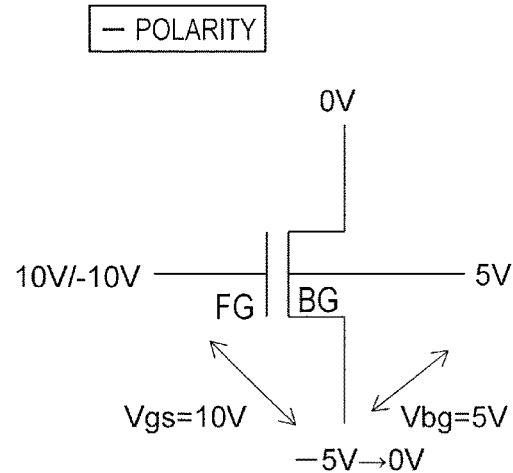
Figure 20A:
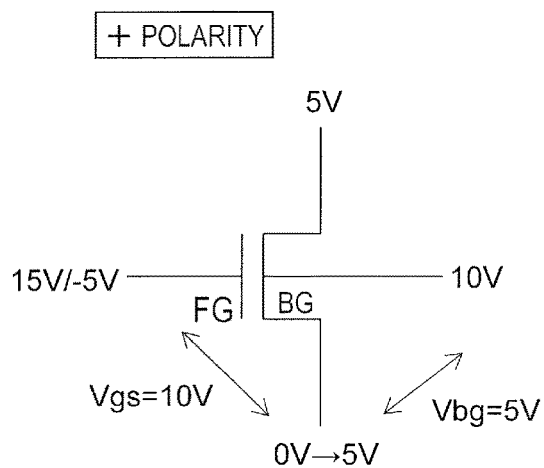
FIGS. 20A and 20B illustrate Example 3 of the control of the back-gate voltage Vbg and the front-gate voltage Vgs.
Figure 20B:
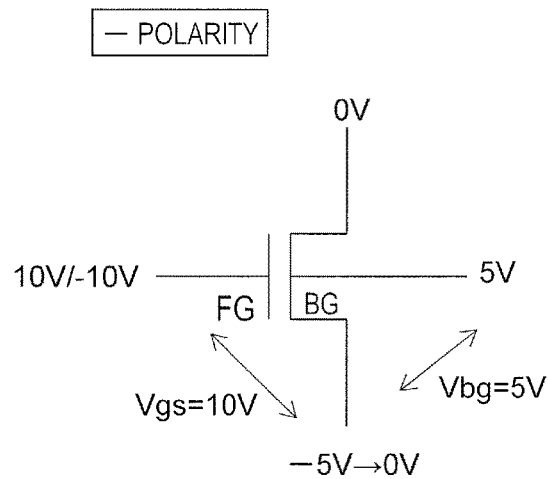

FIGS. 19A and 19B and FIGS. 20A and 20B respectively show Example 1 and Example 2 of the control of the back-gate voltage Vbg in the worst case. FIG. 19A and FIG. 20A show a DMX circuit TFT 71 where a video signal of a positive polarity is supplied to the source bus line SL, and the potential of the source bus line SL is increased from 0 V to +5 V. FIG. 19B and FIG. 20B show a DMX circuit TFT 72 where a video signal of a negative polarity is supplied to the source bus line SL, and the potential of the source bus line SL is increased from −5 V to 0 V.

In Example 1, the signal voltage applied to the back-gate electrode is varied according to the writing polarity, and the same voltage is applied to the front-gate electrode. As shown in FIGS. 19A and 19B, when a voltage of 10V is applied to the back-gate electrode of the DMX circuit TFT 71 and a voltage of 5V is applied to the back-gate electrode of the DMX circuit TFT 72, the back-gate voltage Vbg is 5 V irrespective of the writing polarity. Since the voltages of VGH/LGH=10V/−10V are applied to the front-gate electrodes of the DMX circuit TFTs 71, 72, the gate voltage Vgs of the DMX circuit TFT 71 is 5 V, and the gate voltage Vgs of the DMX circuit TFT 72 is 10 V. Therefore, the drivability of the DMX circuit TFT 71 is lower than that of the DMX circuit TFT 72.

On the other hand, in Example 2, both the signal voltages applied to the back-gate electrode and the front-gate electrode are varied according to the writing polarity. As shown in FIGS. 20A and 20B, the back-gate voltage Vbg is 5 V irrespective of the writing polarity as in Example 1. Meanwhile, a voltage of VGH1/VGL1=15V/5V is applied to the front-gate electrode of the DMX circuit TFT 71, and a voltage of VGH2/VGL2=10V/−10V is applied to the front-gate electrode of the DMX circuit TFT 72. As a result, the gate voltages Vgs of the DMX circuit TFTs 71, 72 are both 10 V. Thus, when the voltage applied to the front-gate electrode is set higher in writing a video signal of a positive polarity than in writing a video signal of a negative polarity, the gate voltage Vgs can be increased in writing a video signal of a positive polarity and, therefore, the drivability improves. In writing a video signal of a negative polarity, sufficient drivability can be secured while keeping low the driving voltage of the control signal.

Figure 21:
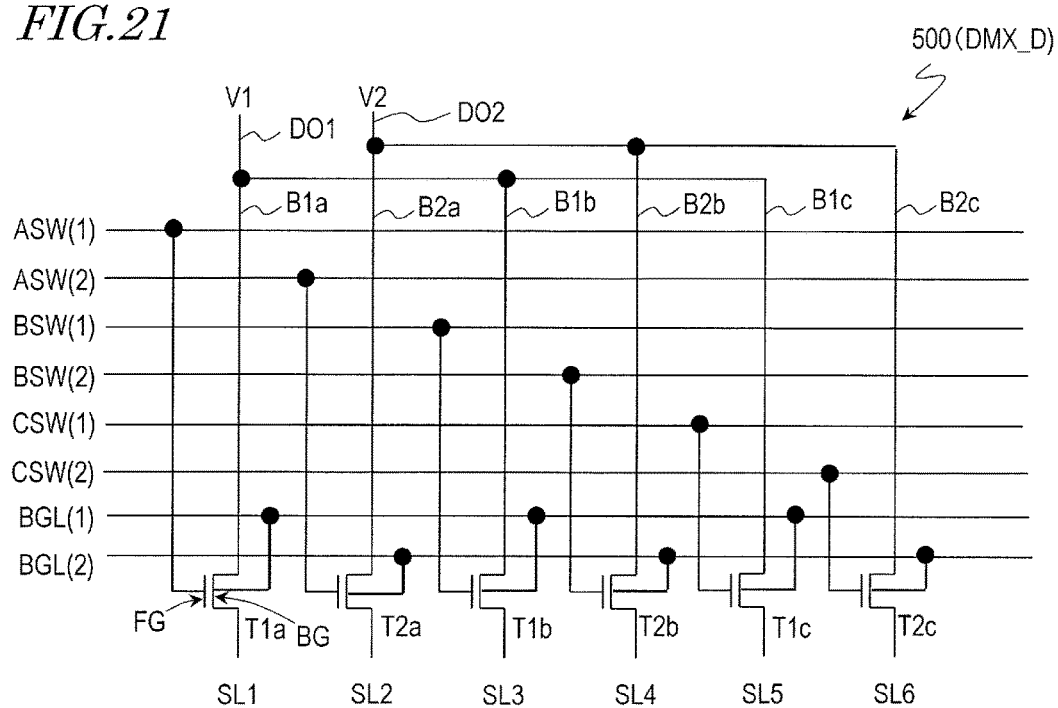
FIG. 21 is a diagram showing a configuration of a sub-circuit 500 of a demultiplexer circuit DMX_D.

FIG. 21 is a diagram showing a configuration of a sub-circuit 500 of an alternative demultiplexer circuit DMX_D of the present embodiment.

The sub-circuit 500 includes the first unit circuit and the second unit circuit. Each unit circuit distributes a video signal V1 from a video signal line DO(N) to three source bus lines SL which occur in every other source bus line (i.e., n=3).

The configuration of the sub-circuit 500 is different from that of the previously-described sub-circuit 300 in that the sub-circuit 500 includes three first control signal main lines ASW(1), BSW(1), CSW(3) and three second control signal main lines ASW(2), BSW(2), CSW(2) as the plurality of control signal main lines. The front-gate electrodes of the thin film transistors T1a, T1b, T1c connected with the first polarity source bus lines are connected with the first control signal main lines ASW(1), BSW(1), CSW(3), respectively. The front-gate electrodes of the thin film transistors T2a, T2b, T2c connected with the second polarity source bus lines are connected with the second control signal main lines ASW(2), BSW(2), CSW(3), respectively. The other constituents are the same as those of the sub-circuit 300.

<Variation and Layout Example of Demultiplexer Circuit>

Figure 22:
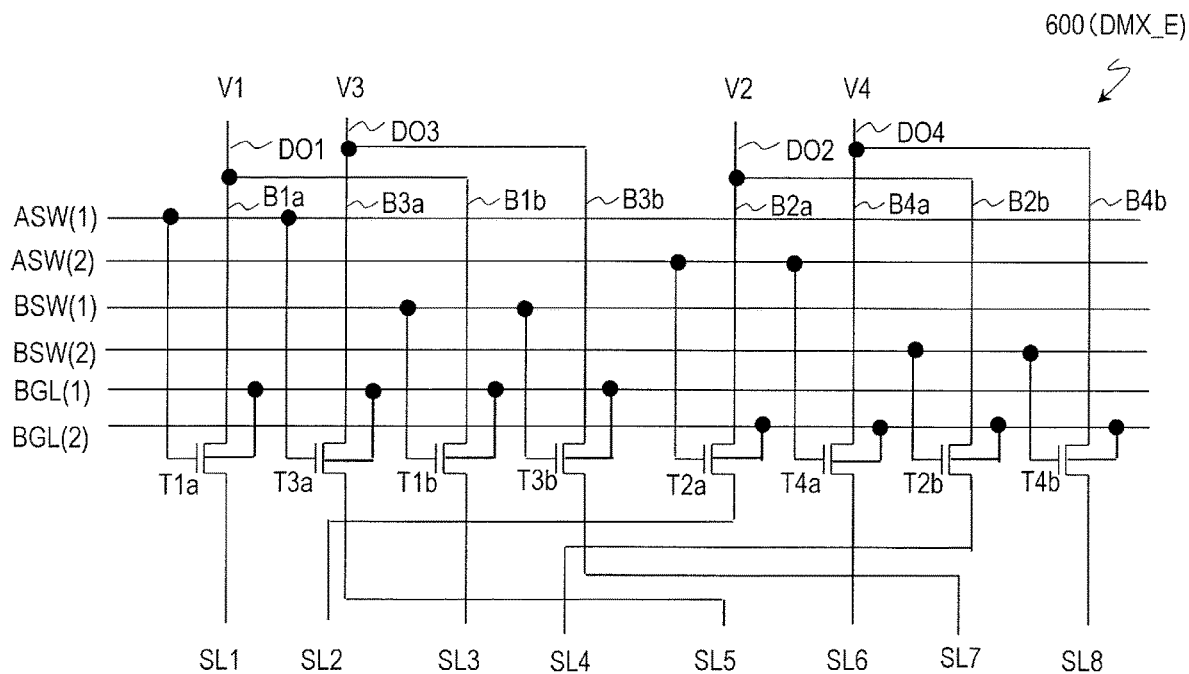
FIG. 22 is a diagram showing a configuration of a sub-circuit 600 of a demultiplexer circuit DMX_E.

FIG. 22 is a diagram showing a variation of the demultiplexer circuit of the present embodiment.

Each sub-circuit 600 in a demultiplexer circuit DMX_E is different from the sub-circuit 400 (FIG. 17) in that the sub-circuit 600 includes the third unit circuit and the fourth unit circuit in addition to the first unit circuit and the second unit circuit. In the display region, n source bus lines of the third unit circuit and n source bus lines of the fourth unit circuit are arranged alternately in a one-by-one fashion in the second direction. In this example, n=2, and eight source bus lines SL1 to SL8 are associated with a single sub-circuit. The source bus lines SL1 to SL8 are arranged in this order in the display region.

Each of the third and fourth unit circuits has the same configuration as that of the first and second unit circuits which has previously been described with reference to FIG. 17. Specifically, the third unit circuit includes thin film transistors T3a, T3b respectively connected with the source bus lines SLS, SL7 and branch lines B3a, B3b connected with a video signal line DO3. The front-gate electrodes of the thin film transistors T3a, T3b are electrically coupled with the first control signal main lines ASW(1), BSW(1), respectively. The back-gate electrodes of the thin film transistors T3a, T3b are electrically coupled with the first back-gate signal main line BGL(1). The fourth unit circuit includes thin film transistors T4a, T4b respectively connected with the source bus lines SL6, SL8 and branch lines B4a, B4b connected with a video signal line DO4. The front-gate electrodes of the thin film transistors T4a, T4b are connected with the second control signal main lines ASW(2), BSW(2), respectively. The back-gate electrodes of the thin film transistors T4a, T4b are electrically coupled with the second back-gate signal main line BGL(2).

Figure 23:
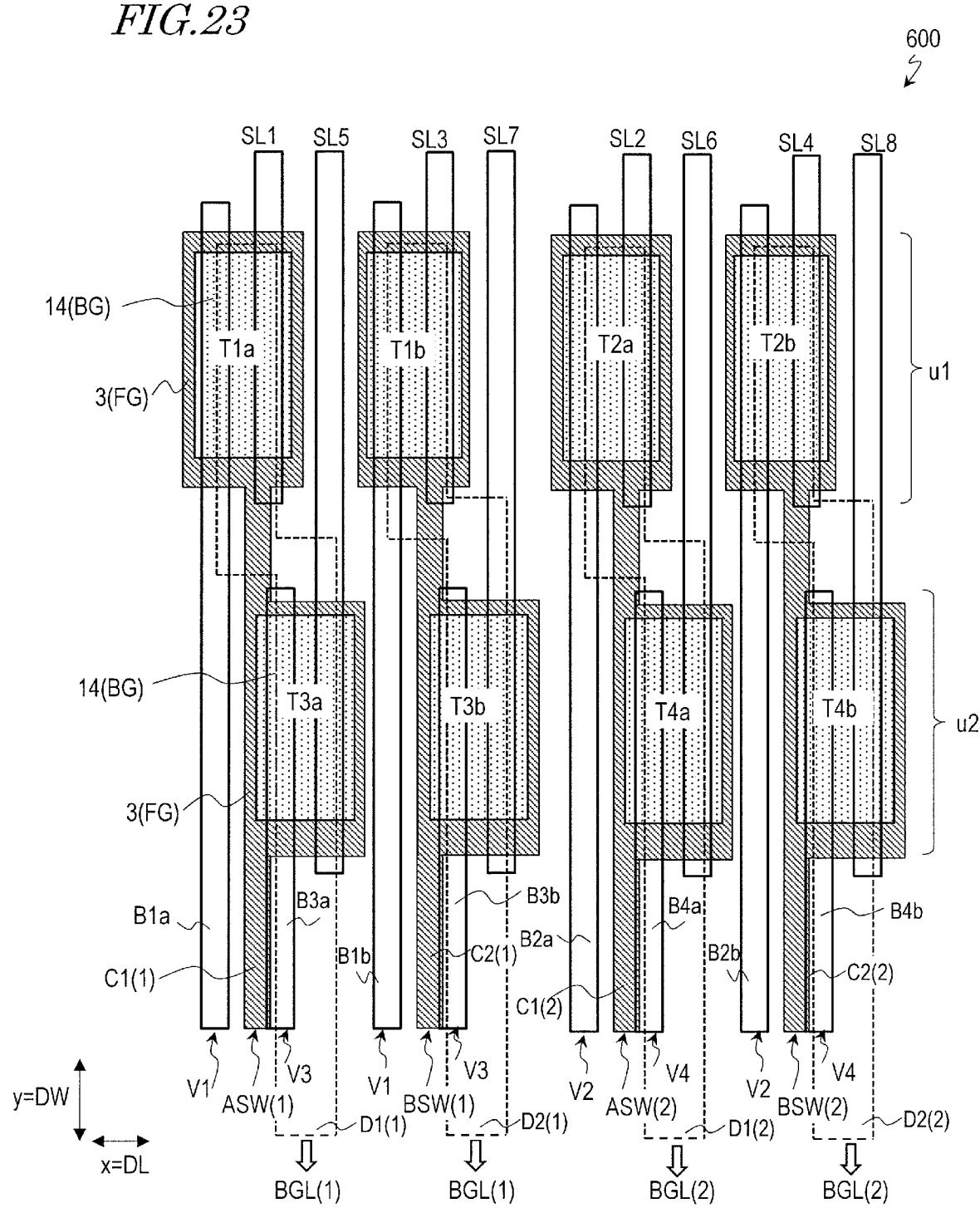
FIG. 23 is a plan view illustrating a layout of the sub-circuit 600 of the demultiplexer circuit DMX_E.

FIG. 23 is an enlarged plan view illustrating a layout of a single sub-circuit 600 in the demultiplexer circuit DMX_E. Hereinafter, the differences from the sub-circuit 200A (FIG. 13) are mainly described, and the description of the same constituents will be omitted.

Each sub-circuit 600 includes n (herein, two) first control signal branch lines C1(1), C2(1), n second control signal branch lines C2(1), C2(2), n first back-gate signal branch lines D1(1), D1(2), and n second back-gate signal branch lines D2(1), D2(2). The first control signal branch lines C1(1), C2(1) are electrically coupled with the first control signal main lines ASW(1), BSW(1), respectively. The second control signal branch lines C2(1), C2(2) are electrically coupled with the second control signal main lines ASW(2), BSW(2), respectively. The first back-gate signal branch lines D1(1), D1(2) are electrically coupled with the first the back-gate signal main line BGL(1). The second back-gate signal branch lines D2(1), D2(2) are electrically coupled with the second back-gate signal main line BGL(2). These control signal branch lines and back-gate signal branch lines may extend in the same direction as the branch lines B and the source bus lines L (y direction) in the demultiplexer circuit.

In this example, in each sub-circuit 600, the thin film transistors T1a, T1b, T2a, T2b of the first unit circuit and the second unit circuit are provided in the first unit circuit formation regions ul. The thin film transistors T3a, T3b, T4a, T4b of the third unit circuit and the fourth unit circuit are provided in the second unit circuit formation regions u2. The first unit circuit formation regions u1 are present between the second unit circuit formation regions u2 and the display region.

The first and third unit circuits may share the first control signal branch lines C1(1), C2(1) and the first back-gate signal branch lines D1(1), D2(1). Herein, the thin film transistors T1a, T1b of the first unit circuit are located on the display region side of the thin film transistors T3a, T3b of the third unit circuit. The thin film transistors T1a, T3a share the first control signal branch line C1(1) and the first back-gate signal branch line D1(1). The thin film transistors T1b, T3b share the first control signal branch line C2(1) and the first back-gate signal branch line D2(1). Likewise, the second and fourth unit circuits may share the second control signal branch lines C1(2), C2(2) and the second back-gate signal branch lines D1(2), D2(2). Herein, the thin film transistors T2a, T2b of the second unit circuit are located on the display region side of the thin film transistors T4a, T4b of the fourth unit circuit. The thin film transistors T2a, T4a share the first control signal branch line C1(2) and the first back-gate signal branch line D1(2). The thin film transistors T2b, T4b share the first control signal branch line C2(2) and the first back-gate signal branch line D2(2). Thus, by sharing not only the control signal branch lines but also the back-gate signal branch lines between thin film transistors adjoining in the y direction, the circuit area can be further reduced.

In each DMX circuit TFT, the front-gate electrode FG is a part of a corresponding one of the first or second control signal branch lines, the back-gate electrode BG is a part of a corresponding one of the first or second back-gate signal branch lines, the source electrode is a part of a corresponding branch line, and the drain electrode is a part of a corresponding source bus line. For example, the front-gate electrodes FG of the thin film transistors T1a, T3a may be parts of (or integrally formed with) the first control signal branch line C1(1), and the back-gate electrode BG may be a part of the first back-gate signal branch line D1(1).

Although not shown, the control signal main lines ASW(1), ASW(2), BSW(1), BSW(2) (generically referred to as "control signal main lines SW") and the back-gate signal main lines BGL(1), BGL(2) (generically referred to as "back-gate signal main lines GBL") may be located on, for example, the source driver side of the second unit circuit formation regions u2 (which is opposite to the display region). These control signal main lines SW and back-gate signal main lines BGL may extend in, for example, the x direction.

The control signal main lines SW and the back-gate signal main lines BGL are preferably formed by a metal film. For example, the control signal main lines SW and the back-gate signal main lines BGL each may be provided in the gate metal layer. In this case, the control signal branch lines C may be provided in the source metal layer, and the back-gate signal branch lines D1(1), D1(2), D2(1), D2(2) may be provided in an electrically-conductive layer (or a transparent electrically-conductive layer) lying above the source metal layer.

In this example, the arrangement of the source bus lines SL is different between a region in which a demultiplexer circuit is to be formed and the display region. Therefore, connection of the source bus lines SL may be changed between, for example, the demultiplexer circuit and the display region.

<Configuration of Pixel Region Pix>

Next, the configuration of each pixel region PIX in the active matrix substrate 1000 is described. Herein, the configuration of the pixel region PIX is described with an example of the active matrix substrate applied to a FFS mode LCD panel.

Figure 24A:
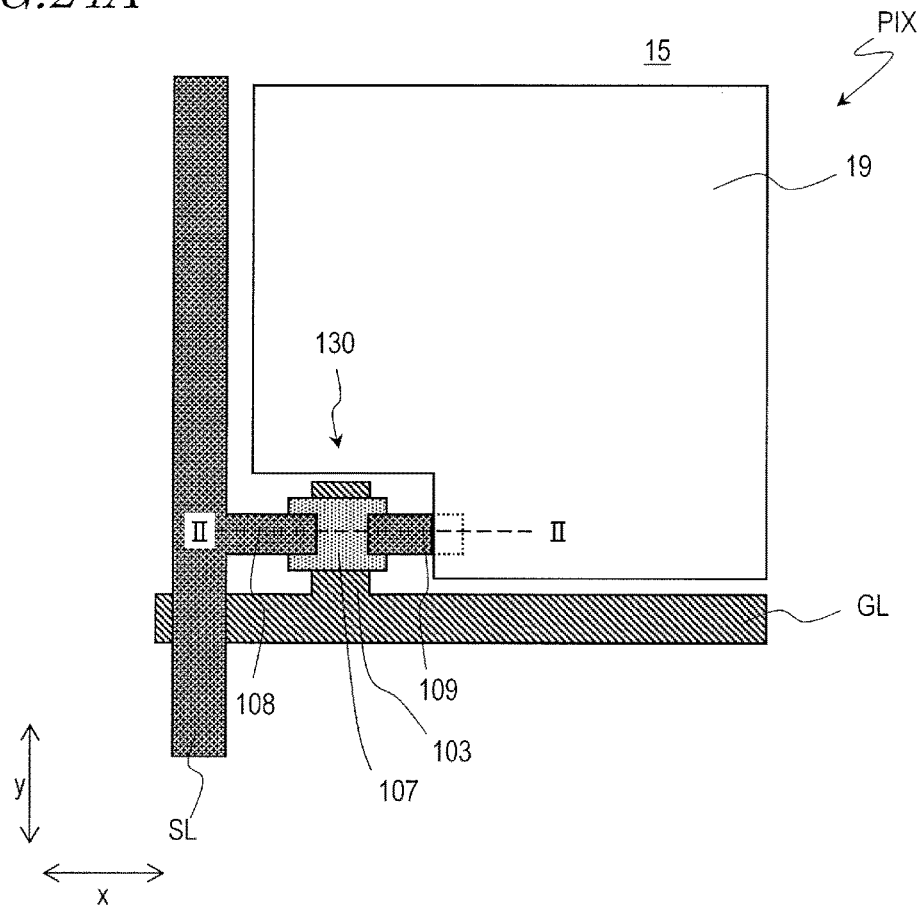
FIGS. 24A and 24B are, respectively, a plan view of a single pixel region PIX in the active matrix substrate 1000 and a cross-sectional view of the pixel region PIX taken along line IV-IV'.
Figure 24B:
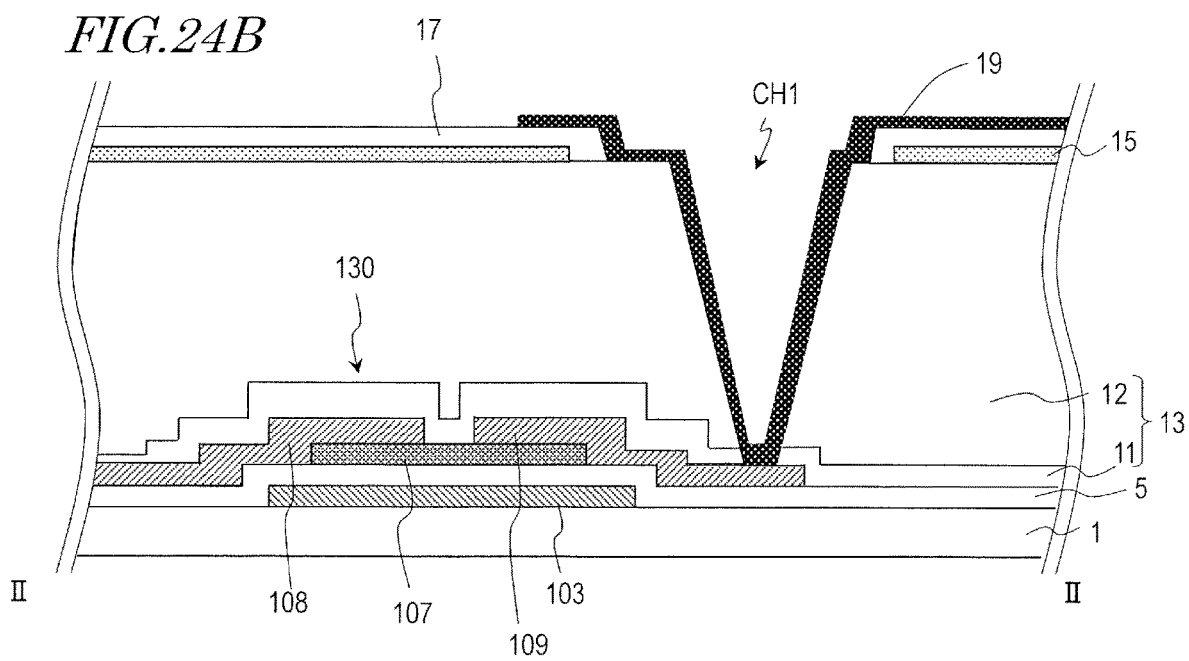

FIGS. 24A and 24B are, respectively, a plan view of a single pixel region PIX in the active matrix substrate 1000 and a cross-sectional view of the pixel region PIX taken along line IV-IV'.

The pixel region PIX is a region surrounded by source bus lines SL extending in the y direction and gate bus lines GL extending in the x direction so as to intersect with the source bus lines SL. The pixel region PIX includes a substrate 1, a TFT (hereinafter, "pixel TFT") 130 supported by the substrate 1, a lower transparent electrode 15, and an upper transparent electrode 19. Although not shown, the upper transparent electrode 19 has a slit or notch in each pixel. In this example, the lower transparent electrode 15 is a common electrode CE, and the upper transparent electrode is a pixel electrode PE. The pixel TFT 10 is, for example, an oxide semiconductor TFT which has a bottom gate structure.

Next, the configuration of the pixel TFT 130 is described more specifically.

The pixel TFT 130 is a TFT of a bottom gate structure which includes a gate electrode (front-gate electrode) 103 supported by the substrate 1, a gate insulating layer 5 covering the gate electrode 103, an oxide semiconductor layer 107 provided on the gate insulating layer 5, and a source electrode 108 and a drain electrode 109 which are arranged so as to be in contact with the oxide semiconductor layer 107. The source electrode 108 and the drain electrode 109 are each in contact with the upper surface of the oxide semiconductor layer 107.

The gate electrode 103 is connected with a corresponding gate bus line GL. The source electrode 108 is connected with a corresponding source bus line SL. The drain electrode 109 is electrically coupled with the pixel electrode PE. The gate electrode 103 and the gate bus line GL may be integrally formed in the gate metal layer. The source electrode 108 and the source bus line SL may be integrally formed in the source metal layer.

Although not particularly limited, an interlayer insulating layer 13 may include, for example, an inorganic insulating layer (passivation film) 11 and an organic insulating layer 12 provided on the inorganic insulating layer 11. Note that the interlayer insulating layer 13 may not include the organic insulating layer 12.

The pixel electrode PE and the common electrode CE are arranged so as to partially overlap each other with a dielectric layer 17 interposed therebetween. The pixel electrodes PE of respective pixels are separated from one another. The common electrodes CE of respective pixels may not be separated from one another. In this example, the common electrode CE is provided on the interlayer insulating layer 13. The common electrode CE may have an opening above a region in which the pixel TFT 10 is provided and may be provided over the entire pixel region PIX exclusive of this region. The pixel electrode PE is provided on the dielectric layer 17 and is electrically coupled with the drain electrode 109 inside an opening CH1 provided in the interlayer insulating layer 13 and the dielectric layer 17.

The thus-configured active matrix substrate 1000 is applicable to, for example, a FFS mode display device. The FFS mode is a transverse electric field mode in which a pair of electrodes are provided on one substrate and an electric field is applied to liquid crystal molecules in a direction parallel to the substrate surface (transverse direction). In this example, an electric field is produced which is represented by a line of electric force coming out from the pixel electrode PE and passing through the liquid crystal layer (not shown) and then through a slit-like opening of the pixel electrode PE before reaching the common electrode CE.

This electric field includes a component transverse to the liquid crystal layer. As a result, a transverse electric field can be applied across the liquid crystal layer. In the transverse electric field mode, the liquid crystal molecules do not rise from the substrate, and therefore, there is an advantage that a wider viewing angle can be realized than in the vertical electric field mode.

An electrode structure in which the pixel electrode PE is provided on the common electrode CE with the dielectric layer 17 interposed therebetween is disclosed in, for example, WO 2012/086513. Note that the common electrode CE may be provided on the pixel electrode PE with the dielectric layer 17 interposed therebetween. That is, the lower transparent electrode 15 provided in the lower transparent electrically-conductive layer may be the pixel electrode PE, and the upper transparent electrode 19 provided in the upper transparent electrically-conductive layer may be the common electrode CE. Such an electrode structure is disclosed in, for example, Japanese Laid-Open Patent Publication No. 2008-032899 and Japanese Laid-Open Patent Publication No. 2010-008758. The entire disclosures of WO 2012/086513, Japanese Laid-Open Patent Publication No. 2008-032899 and Japanese Laid-Open Patent Publication No. 2010-008758 are incorporated by reference in this specification.

<Material and Thickness of Layers of Active Matrix Substrate 1000>

The substrate 1 can be, for example, a glass substrate, a silicon substrate, a heat-resistant plastic substrate (resin substrate), or the like.

The gate metal layer (thickness: for example, not less than 50 nm and not more than 500 nm), which includes the lower gate electrode 3 and the gate bus lines GL, is made of, for example, a metal such as aluminum (Al), tungsten (W), molybdenum (Mo), tantalum (Ta), chromium (Cr), titanium (Ti), copper (Cu), or the like, or an alloy thereof, or a metal nitride thereof. Alternatively, the gate metal layer may be formed by a multilayer film consisting of a plurality of such films. The gate metal layer can be formed by forming a metal film on the substrate 1 by sputtering, or the like, and patterning the metal film through a known photolithography process (photoresist application, exposure, development, etching, resist removal). The etching is realized by, for example, wet etching.

The gate insulating layer 5 (thickness: for example, not less than 200 nm and not more than 500 nm) may be, for example, a silicon oxide (SiOx) layer, a silicon nitride (SiNx) layer, a silicon oxynitride (SiOxNy; x>y) layer, a silicon nitroxide (SiNxOy; x>y) layer, or the like. The gate insulating layer 5 may have a multilayer structure. In that case, by providing a $SiO_2$ film on a side of the gate insulating layer 5 which is in contact with the oxide semiconductor layer 7, the oxygen deficiencies in the oxide semiconductor layer 7 can be effectively reduced.

The oxide semiconductor layer 7 is formed by an oxide semiconductor film of, for example, an In—Ga—Zn—O based semiconductor (thickness: for example, not less than 15 nm and not more than 200 nm).

The source metal layer (thickness: for example, not less than 50 nm and not more than 500 nm), which includes the source electrode 8, the drain electrode 9 and the source bus lines SL, is formed using a film which includes, for example, a metal such as aluminum (Al), tungsten (W), molybdenum (Mo), tantalum (Ta), chromium (Cr), titanium (Ti), copper (Cu), or the like, or an alloy thereof, or a metal nitride thereof. Alternatively, the source metal layer may be formed by a multilayer film consisting of a plurality of such films.

The source metal layer may have a multilayer structure consisting of a Ti film (thickness: 30 nm), an Al or Cu film (thickness: 300 nm), and a Ti film (thickness: 50 nm) stacked in this order from the oxide semiconductor layer.

The inorganic insulating layer 11 (thickness: for example, 100-500 nm, preferably 200-500 nm) is formed by, for example, an inorganic insulating film (passivation film), such as a silicon oxide (SiOx) film, a silicon nitride (SiNx) film, a silicon oxynitride (SiOxNy; x>y) film, a silicon nitroxide (SiNxOy; x>y) film, or the like. The inorganic insulating layer 11 may have a multilayer structure. When a $SiO_2$ film is provided on a side of the inorganic insulating layer 11 which is in contact with the oxide semiconductor layer 7, the oxygen deficiencies in the oxide semiconductor layer 7 can be effectively reduced.

The organic insulating layer 12 (thickness: for example, 1-3 μm, preferably 2-3 μm) is formed by, for example, an organic insulating film which includes a photosensitive resin material.

The lower transparent electrode 15 and the upper transparent electrode 19 (thickness: for example, not less than 50 nm and not more than 200 nm) each may be formed by, for example, an ITO (indium tin oxide) film, an In—Zn—O based oxide (indium zinc oxide) film, a ZnO film (zinc oxide film), or the like. The second inorganic insulating layer 17 (thickness: for example, not less than 70 nm and not more than 300 nm) may be formed by a silicon nitride (SiNx) film, a silicon oxide (SiOx) film, a silicon oxynitride (SiOxNy; x>y) film, a silicon nitroxide (SiNxOy; x>y) film, or the like.

<TFT Structure>

The DMX circuit TFT illustrated in FIGS. 5A and 5B is a channel etch type TFT. In the channel etch type TFT, an etch stop layer is not provided on the channel region, and the lower surfaces of the channel side edges of the source and drain electrodes are arranged so as to be in contact with the upper surface of the oxide semiconductor layer. The channel etch type TFT is formed by, for example, forming an electrically-conductive film for source and drain electrodes on the oxide semiconductor layer and performing source-drain separation. In the source-drain separation step, a surface portion of the channel region is etched away in some cases.

The structure of the DMX circuit TFT of the present embodiment is not limited to the examples illustrated in the drawings. The DMX circuit TFT may have an etch stop structure in which an etch stop covers the channel region. As the etch stop layer, for example, an insulating layer which includes oxygen, such as a $SiO_2$ layer, can be used. In a TFT which has the etch stop structure, the channel side edges of the source and drain electrodes are present on, for example, the etch stop layer. An etch stop type TFT is formed by, for example, forming an etch stop layer so as to cover a part of the upper surface of a semiconductor layer which is to be the channel region and, thereafter, forming an electrically-conductive film for source and drain electrodes on the semiconductor layer and the etch stop layer and performing source-drain separation. Still alternatively, the DMX circuit TFT of the present embodiment may have a top contact structure in which the source and drain electrodes are in contact with the upper surface of the semiconductor layer or may have a bottom contact structure in which the source and drain electrodes are in contact with the lower surface of the semiconductor layer.

<Oxide Semiconductor>

The oxide semiconductor included in the oxide semiconductor layer may be an amorphous oxide semiconductor or may be a crystalline oxide semiconductor which includes a crystalline portion. Examples of the crystalline oxide semiconductor include a polycrystalline oxide semiconductor, a microcrystalline oxide semiconductor, and a crystalline oxide semiconductor in which the c-axis is oriented generally perpendicular to the layer surface.

The oxide semiconductor layer may have a multilayer structure consisting of two or more layers. When the oxide semiconductor layer has a multilayer structure, the oxide semiconductor layer may include a non-crystalline oxide semiconductor layer and a crystalline oxide semiconductor layer. Alternatively, the oxide semiconductor layer may include a plurality of crystalline oxide semiconductor layers which have different crystalline structures. The oxide semiconductor layer may include a plurality of non-crystalline oxide semiconductor layers. When the oxide semiconductor layer has a two-layer structure which includes the upper layer and the lower layer, it is preferred that the energy gap of the oxide semiconductor included in the upper layer is greater than the energy gap of the oxide semiconductor included in the lower layer. Note that, however, when the difference in energy gap between these layers is relatively small, the energy gap of the oxide semiconductor of the lower layer may be greater than the energy gap of the oxide semiconductor of the upper layer.

The materials, structures and film formation methods of the non-crystalline oxide semiconductor and the respective aforementioned crystalline oxide semiconductors, and the configuration of the oxide semiconductor layer which has a multilayer structure, are disclosed in, for example, Japanese Laid-Open Patent Publication No. 2014-007399. The entire disclosure of Japanese Laid-Open Patent Publication No. 2014-007399 is incorporated by reference in this specification.

The oxide semiconductor layer may include, for example, at least one metal element among In, Ga and Zn. In the present embodiment, the oxide semiconductor layer includes, for example, an In—Ga—Zn—O based semiconductor (e.g., indium gallium zinc oxide). Here, the In—Ga—Zn—O based semiconductor is a ternary oxide including In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The oxide semiconductor layer which has such a composition can be formed by an oxide semiconductor film which includes an In—Ga—Zn—O based semiconductor.

The In—Ga—Zn—O based semiconductor may be amorphous or may be crystalline. As the crystalline In—Ga—Zn—O based semiconductor, a crystalline In—Ga—Zn—O based semiconductor in which the c-axis is oriented generally perpendicular to the layer surface is preferred.

The crystalline structure of the crystalline In—Ga—Zn—O based semiconductor is disclosed in, for example, aforementioned Japanese Laid-Open Patent Publication No. 2014-007399, Japanese Laid-Open Patent Publication No. 2012-134475, and Japanese Laid-Open Patent Publication No. 2014-209727. The entire disclosures of Japanese Laid-Open Patent Publication No. 2012-134475 and Japanese Laid-Open Patent Publication No. 2014-209727 are incorporated by reference in this specification. A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT (e.g., a TFT included in a driving circuit provided around the display region including a plurality of pixels on the same substrate as the display region) and a pixel TFT (a TFT provided in a pixel).

The oxide semiconductor layer may contain a different oxide semiconductor instead of the In—Ga—Zn—O based semiconductor. For example, the oxide semiconductor layer may contain an In—Sn—Zn—O based semiconductor (e.g., $In_2O_3$—$SnO_2$—ZnO; InSnZnO). In—Sn—Zn—O based semiconductor is a ternary oxide including In (indium), Sn (tin) and Zn (zinc). Alternatively, the oxide semiconductor layer 5 may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, or the like.

In the present embodiment, an oxide semiconductor TFT is used as the DMX circuit TFT, although a TFT including an active layer which is made of a semiconductor other than the oxide semiconductor may be used. The DMX circuit TFT may be, for example, a non-crystalline silicon semiconductor TFT, a crystalline silicon semiconductor TFT, or the like.

The embodiments of the present invention are suitably applicable to an active matrix substrate which includes a monolithically-formed demultiplexer circuit. Such an active matrix substrate is applicable to display devices such as liquid crystal display devices, organic electroluminescence (EL) display devices, and inorganic electroluminescence display devices, imaging devices such as image sensor devices, and various electronic devices such as image input devices, fingerprint readers, and semiconductor memories.

This application is based on Japanese Patent Applications No. 2017-172610 filed on Sep. 8, 2017the entire contents of which are hereby incorporated by reference.

What is claimed is:

1. An active matrix substrate having a display region including a plurality of pixels and a non-display region provided around the display region, the active matrix substrate comprising:
a substrate;
a demultiplexer circuit provided in the non-display region and supported by the substrate; and
a plurality of source bus lines extending in a first direction and a plurality of gate bus lines extending in a second direction in the display region, the second direction intersecting with the first direction,
wherein the demultiplexer circuit includes a plurality of unit circuits, a plurality of DMX circuit TFTs, a plurality of control signal main lines, and a plurality of back-gate signal main lines which include at least a first back-gate signal main line and a second back-gate signal main line,
each of the plurality of unit circuits is capable of distributing a video signal from one of a plurality of video signal lines to n source bus lines out of the plurality of source bus lines, n being an integer not less than 2,
each of the plurality of unit circuits includes at least n DMX circuit TFTs out of the plurality of DMX circuit TFTs, n branch lines connected with the one video signal line, and the n source bus lines, each of the plurality of DMX circuit TFTs includes a lower gate electrode, a semiconductor layer provided on the lower gate electrode with a first insulating layer interposed therebetween, a source electrode and a drain electrode electrically coupled with the semiconductor layer, and an upper gate electrode provided on the semiconductor layer with a second insulating layer interposed therebetween, one of the upper gate electrode and the lower gate electrode is a front-gate electrode to which a control signal is supplied from one of the plurality of control signal main lines, and the other gate electrode is a back-gate electrode to which a back-gate signal is supplied, the back-gate signal being different from the control signal, the drain electrode is electrically coupled with one of the n source bus lines, and the source electrode is electrically coupled with one of the n branch lines, the plurality of DMX circuit TFTs includes
first DMX circuit TFTs, the back-gate electrode of each of the first DMX circuit TFTs being connected with the first back-gate signal main line which supplies a first back-gate signal, and
second DMX circuit TFTs, the back-gate electrode of each of the second DMX circuit TFTs being connected with the second back-gate signal main line which supplies a second back-gate signal which is different from the first back-gate signal.

2. The active matrix substrate of claim 1, wherein the video signal supplied to some source bus lines and the video signal supplied to some other source bus lines are a first video signal and a second video signal which have opposite polarities, each of the some source bus lines being connected to one of the first DMX circuit TFTs, and each of the some other source bus lines being connected to one of the second DMX circuit TFTs.

3. The active matrix substrate of claim 2, wherein
when the first video signal has a positive polarity and the second video signal has a negative polarity, a potential of the first back-gate signal is higher than a potential of the second back-gate signal, and
when the first video signal has a negative polarity and the second video signal has a positive polarity, a potential of the first back-gate signal is lower than a potential of the second back-gate signal.

4. The active matrix substrate of claim 2, wherein
each of the first video signal and the second video signal is a signal whose polarity reverses at predetermined intervals,
a potential of the first back-gate signal varies at the predetermined intervals according to a variation of the polarity of the first video signal such that the potential of the first back-gate signal is at a high level when the first video signal has a positive polarity and that the potential of the first back-gate signal is at a low level when the first video signal has a negative polarity, and
a potential of the second back-gate signal varies at the predetermined intervals according to a variation of the polarity of the second video signal such that the potential of the second back-gate signal is at a high level when the second video signal has a positive polarity and that the potential of the second back-gate signal is at a low level when the second video signal has a negative polarity.

5. The active matrix substrate of claim 2, wherein
the demultiplexer circuit includes a plurality of sub-circuits, each of the sub-circuits includes at least first and second unit circuits out of the plurality of unit circuits, and
in the each sub-circuit, the n source bus lines of the first unit circuit and the n source bus lines of the second unit circuit are arranged alternately in a one-by-one fashion in the second direction in the display region.

6. The active matrix substrate of claim 5, wherein the n source bus lines of the first unit circuit is supplied with the first video signal, and the n source bus lines of the second unit circuit is supplied with the second video signal.

7. The active matrix substrate of claim 5, wherein
each of the plurality of unit circuits further includes n control signal branch lines, each of the n control signal branch lines being electrically coupled with one of the plurality of control signal main lines, and
the n control signal branch lines in the first unit circuit and the second unit circuit are common.

8. The active matrix substrate of claim 7, wherein
the front-gate electrode of the each DMX circuit TFT is a part of one of the n control signal branch lines, the source electrode of the each DMX circuit TFT is a part of one of the n branch lines, and the drain electrode of the each DMX circuit TFT is a part of one of the n source bus lines, and
in each of the plurality of unit circuits, each of the n control signal branch lines, the n branch lines and the n source bus lines extends in the first direction.

9. The active matrix substrate of claim 7, wherein in the each sub-circuit, a first unit circuit formation region in which the at least n DMX circuit TFTs of the first unit circuit are to be formed is present between a second unit circuit formation region in which the at least n DMX circuit TFTs of the second unit circuit are to be formed and the display region.

10. The active matrix substrate of claim 9, wherein at least one of the first back-gate signal main line and the second back-gate signal main line extends in the second direction through a gap between the first unit circuit formation region and the second unit circuit formation region.

11. The active matrix substrate of claim 5, wherein
the plurality of control signal main lines includes a plurality of first control signal main lines and a plurality of second control signal main lines,
the front-gate electrode of the each of the first DMX circuit TFTs is connected with one of the plurality of first control signal main lines,
the front-gate electrode of the each of the second DMX circuit TFTs is connected with one of the plurality of second control signal main lines,
when the first video signal has a positive polarity and the second video signal has a negative polarity, a high-level potential of the control signal supplied from the plurality of first control signal main lines is higher than a high-level potential of the control signal supplied from the plurality of second control signal main lines, and
when the first video signal has a negative polarity and the second video signal has a positive polarity, a high-level potential of the control signal supplied from the plurality of first control signal main lines is lower than a high-level potential of the control signal supplied from the plurality of second control signal main lines.

12. The active matrix substrate of claim 11, wherein
the each sub-circuit further includes third and fourth unit circuits out of the plurality of unit circuits, and the n source bus lines of the third unit circuit and the n source bus lines of the fourth unit circuit are arranged alternately in a one-by-one fashion in the second direction in the display region, the first and third unit circuits share n first control signal branch lines each electrically coupled with any of the first control signal main lines and n first back-gate signal branch lines electrically coupled with the first back-gate signal main line, and the second and fourth unit circuits share n second control signal branch lines each electrically coupled with any of the second control signal main lines and n second back-gate signal branch lines electrically coupled with the second back-gate signal main line.

13. The active matrix substrate of claim 12, wherein the front-gate electrode of the each DMX circuit TFT is a part of one of the n first or second control signal branch lines, the back-gate electrode of the each DMX circuit TFT is a part of one of the n first or second back-gate signal branch lines, the source electrode of the each DMX circuit TFT is a part of one of the n branch lines, and the drain electrode of the each DMX circuit TFT is a part of one of the n source bus lines, and in the each sub-circuit, each of the n first control signal branch lines, the n second control signal branch lines, the n first back-gate signal branch lines, the n second back-gate signal branch lines, the n branch lines and the n source bus lines extends in the first direction.

14. The active matrix substrate of claim 12, wherein in the each sub-circuit, a first unit circuit formation region in which the at least n DMX circuit TFTs of the first unit circuit and the second unit circuit are to be formed is present between a second unit circuit formation region in which the at least n DMX circuit TFTs of the third unit circuit and the fourth unit circuit are to be formed and the display region.

15. The active matrix substrate of claim 1, wherein the semiconductor layer is an oxide semiconductor layer.

16. The active matrix substrate of claim 15, wherein the oxide semiconductor layer includes an In—Ga—Zn—O based semiconductor.

17. The active matrix substrate of claim 16, wherein the In—Ga—Zn—O based semiconductor includes a crystalline portion.

18. A demultiplexer circuit, comprising:
a plurality of unit circuits;
a plurality of DMX circuit TFTs;
a plurality of control signal main lines; and
a plurality of back-gate signal main lines including at least a first back-gate signal main line and a second back-gate signal main line,
wherein each of the plurality of unit circuits is capable of distributing a video signal from one of a plurality of video signal lines to n source bus lines out of a plurality of source bus lines, n being an integer not less than 2,
each of the plurality of unit circuits includes at least n DMX circuit TFTs out of the plurality of DMX circuit TFTs, n branch lines connected with the one video signal line, and the n source bus lines,
each of the plurarity of DMX circuit TFTs includes a lower gate electrode, a semiconductor layer provided on the lower gate electrode with a first insulating layer interposed therebetween, a source electrode and a drain electrode electrically coupled with the semiconductor layer, and an upper gate electrode provided on the semiconductor layer with a second insulating layer interposed therebetween, one of the upper gate electrode and the lower gate electrode is a front-gate electrode to which a control signal is supplied from one of the plurality of control signal main lines, and the other gate electrode is a back-gate electrode to which a back-gate signal is supplied, the back-gate signal being different from the control signal,
the drain electrode is electrically coupled with one of the n source bus lines, and the source electrode is electrically coupled with one of the n branch lines,
the plurality of DMX circuit TFTs includes
first DMX circuit TFTs, the back-gate electrode of each of the first DMX circuit TFTs being connected with the first back-gate signal main line which supplies a first back-gate signal, and
second DMX circuit TFTs, the back-gate electrode of each of the second DMX circuit TFTs being connected with the second back-gate signal main line which supplies a second back-gate signal which is different from the first back-gate signal.

* * * * *